United States Patent [19]
Nakaoka

[11] Patent Number: 5,991,210
[45] Date of Patent: Nov. 23, 1999

[54] SEMICONDUCTOR INTEGRATED CIRCUIT

[75] Inventor: Yoshito Nakaoka, Tokyo, Japan

[73] Assignee: Mitsubishi Denki Kabushiki Kaisha, Tokyo, Japan

[21] Appl. No.: 09/138,409

[22] Filed: Aug. 24, 1998

[30] Foreign Application Priority Data

Mar. 13, 1998 [JP] Japan ................... 10-63405

[51] Int. Cl.$^6$ ........................................... G11C 7/00
[52] U.S. Cl. .................... 365/190; 365/156; 365/168; 365/189.05
[58] Field of Search .................... 365/190, 156, 365/168, 189.05

[56] References Cited

U.S. PATENT DOCUMENTS 5,625,599  4/1997  Okamura ............... 365/190 X

FOREIGN PATENT DOCUMENTS

| | | |
|---|---|---|
| 64-14792 | 1/1989 | Japan . |
| 2-101773 | 4/1990 | Japan . |
| 5-54651 | 3/1993 | Japan . |
| 7-271712 | 10/1995 | Japan . |
| 9-139073 | 5/1997 | Japan . |

*Primary Examiner*—Do Hyun Yoo
*Attorney, Agent, or Firm*—McMermott, Will & Emery

[57] ABSTRACT

A semiconductor integrated circuit having a standard pair of complementary data lines subjected to ternary control, through which data complementary to each other are transmitted when valid data are transmitted, single data lines subjected to binary control, through which data of the same system as that of the pair of complementary data lines are transmitted and a circuit for detecting valid data in a standard intermediate latch circuit which detects an event that the data transmitted through the standard pair of complementary data lines are changed to data complementary to each other, wherein the circuit for detecting valid data confirms arrival of the valid data and controls data corresponding to the data transmitted through the single data lines, to thereby reduce the number of pairs of data lines for narrowing an wiring area of the data lines and reducing a chip size while maintaining a high speed operation.

11 Claims, 29 Drawing Sheets

5,991,210

1

SEMICONDUCTOR INTEGRATED CIRCUIT

BACKGROUND OF THE INVENTION

1. Field of the Invention

The present invention relates to a configuration of signal lines in a semiconductor integrated circuit, in particular, a configuration of signal lines which can realize a high access speed and a reduction of chip size simultaneously.

2. Discussion of Background

A semiconductor integrated circuit has been improved variously in order to obtain a high access speed. As one of these improvements, a method that, in a semiconductor integrated circuit having memories, a line called data line, through which data to be read out from a memory cell or data to be written in a memory cell is transmitted, is composed of a pair of signal lines; and data to be read out from the memory cell or data to be written in the memory cell are transmitted through the paired data line has been widely used. When the data read out from the memory cell or the data to be written in the memory cell is transmitted to the paired data lines which have been pre-charged in advance, the data exist in the paired data lines have values which are complementary to each other. Provided that the data read out from the memory cell or the data to be written in the memory cell are called valid data, in a case that the data lines are composed to have paired structure, a time when data transmitted through the paired data lines have values complementary to each other is a time when the valid data are transmitted.

As a configuration of paired data lines, for example, there is proposed a semiconductor integrated circuit disclosed in Japanese Unexamined Patent Publication Hei 2-101773 (JP-A-2-101773), wherein the semiconductor integrated circuit is composed such that data lines are constituted to be paired and countermeasures against the increment of the number of data lines caused by increasing bits and expanding capacities in recent dynamic random access memories (DRAM) are disclosed.

Meanwhile, FIG. 32 is a block diagram for showing prior art in which only single data lines are used to connect a preamplifier with a main amplifier of an ordinary DRAM.

In FIG. 32, a numerical reference 001 designates an array block of the DRAM. An i/o line area 200 is constituted by a plurality of paired i/o lines; and a preamplifier area 300 is constituted by preamplifiers pa0 through pan, which are provided in correspondence with the paired i/o lines respectively. Data in a memory cell in the memory cell array block 100 read out through the paired bit lines are amplified by the preamplifiers pa0 through pan after passing through paired i/o lines respectively. Data line area of a first system 400 is composed of single data lines rd0 through rdn, each one of which is connected to a corresponding preamplifier among the preamplifiers pa0 through pan, and transmits the data of memory cell amplified by the preamplifiers pa0 through pan. These data transmitted through the data lines rd0 through rdn of the first system are held temporarily in an intermediate latch circuit area 500 composed of intermediate latch circuits la0 through lan, which are respectively connected to the data lines rd0 through rdn of the first system; transmitted through single data lines od0 through odn in a data line area of a second system 600, each one of the single data lines od0 through odn connected to a corresponding intermediate latch circuit among the intermediate latch circuits la0 through lan; and reached to main amplifiers ma0 through man respectively in a main amplifier area 700. Further, these main amplifiers ma0 through man output from input/output ter-

2 minals dq0 through dqn in a group of input/output terminals 010 to the outside.

FIG. 33 is a timing chart for showing an operation of conventional DRAM shown in FIG. 32.

In FIG. 33, references i/o, /i/o designate data in memory cell transmitted through paired bit lines and a sense amplifier to the paired i/o lines. In this, a case that identical data are read out so as to be transmitted the paired i/o lines represented by 0 through n. A reference pae designates a preamplifier activation signal; a reference rdi designates data to be transmitted through one of the single data lines of the first system rd0 to rdn; a reference rdL designates a signal for controlling data holding of the intermediate latch circuits la0 through lan; a reference odi designates data to be transmitted through one of the data lines of the second system od0 to odn which are outputs from the intermediate latch circuits la0 to lan; a reference oem designates an output control signal of the main amplifier, which is generated by delaying the signal for controlling data holding rdL; and a reference dqi designates data to be output from one of the input/output terminals dq0 through dqn. In the Figure, a reference (HO) designates a case that the data output from the one of the input/output terminals dq0 through dqn are data of a high level (H level), and a reference (L0) designates a case that the data are of a low level (L level).

Data in a memory cell in an address designated at a time T00 appear in paired i/o lines through paired bit lines and the sense amplifier.

At a time T01, the preamplifier activation signal pae becomes the H level and the preamplifier is activated. The data of the memory cell appeared in the paired i/o lines are subjected to a differential amplification by the activated preamplifier and the L level is output to one of the data lines of the first system rd0 through rdn.

The signal for controlling data holding rdL of the intermediate latch circuit, which is in the H level in advance at a time T02, becomes the H level by a delay of the preamplifier activation signal pae. In accordance with this change, the data transmitted from the one of the data lines of the first system rd0 through rdn is held in the intermediate latch circuit and output to one of the data lines of the second system od0 through odn. The period between the time T01 and the time T02 is designed based on a result obtained by calculating accurately and predicting by a simulation or the like in advance such that the amplified data outputs from the preamplifiers pa0 through pan are transmitted through the data lines of the first system rd0 through rdn, arrive at the intermediate latch circuits la0 through lan, and are held securely therein.

At a time T03, the output control signal oem of the main amplifier is activated, in other words, becomes the H level. In response thereto, transmitted data are output from one of the input/output terminals dq0 through dqn by the maim amplifier. Timing for activating the output control signal oem is also designed based on a result obtained by calculating minutely a time when data to be transmitted through one of the data lines of the second system od0 through odn arrive at a corresponding main amplifier by a simulation or the like, in a similar manner to that of the timing of the above-mentioned signal for controlling data holding rdL.

However, the conventional semiconductor integrated circuit has a problem that a size of chip became unfavorably large because, for example, when all of data lines were constituted by pairs of lines, the data lines occupied a very large area for wiring in a chip area of the semiconductor integrated circuit in accordance with an increasing number of pins, a configuration of bank and an increasing bit capacity, which have been especially prevailing in recent years, and therefore the size of chip in the semiconductor integrated circuit was restricted by the area for wiring.

Further, there were problems that wiring of paired data lines for obtaining a high speed became extraordinarily long because a layout of semiconductor integrated circuit is restricted by an increment of the number of wirings and the data lines had to be provided in a wiring layer having a high resistance value and a high capacitance value. Further, there was a problem that a yield was affected because connections between different wiring layers had to be realized by contacting these as a result of a complicated layout and thereby a defective opening of contact, a disconnection of wire, a short circuit and so on are apt to occur at a time of manufacturing the semiconductor integrated circuit.

On the other hand, in a case of the structure shown in FIG. 32, the area for wiring becomes about a half of that in comparison with that in the structure made of paired data lines, whereby it was very effective for reducing the size of chip. However, it was necessary to conduct a simulation by considering or assuming various elements such as every data line, a wiring length of signal line, a configuration of lines, a material of line and a margin of operating temperature in order for setting functional timings of the signals rdL and oem for controlling the data holding in the intermediate latch circuit, an output from the main amplifier and so on. Further, in such case, there was a problem that a high speed operation was not effectively conducted because the timings of control signals were set based on a case that transmission of data was slowest, namely, the worst condition.

Further, there was a problem that a yield was greatly affected because a delicate adjusting of the timing introduces malfunctions depending on a scattering in a manufacturing process.

Practically, a semiconductor integrated circuit using paired data lines for most of data lines in order to attain a high speed operation is increasingly used despite that a large capacity of the semiconductor integrated circuit is pursued in these several years.

SUMMARY OF THE INVENTION

It is an object of the present invention to solve the above-mentioned problems inherent in the prior art and to provide a semiconductor integrated circuit which can be operated at a high speed and can reduce a chip area.

Another object of the present invention is to obtain a semiconductor integrated circuit having a stable yield which is not largely affected by a manufacturing process.

According to a first aspect of the present invention, there is provided a semiconductor integrated circuit comprising a pair of complementary data lines through which mutually complementary data are transmitted when valid data are transmitted under ternary control, a single data line through which data of the same system as that of the pair of complementary data lines under binary control and a circuit for detecting valid data which confirms arrival of valid data by detecting that the data transmitted through the pair of complementary data lines are changed to mutually complementary data and generates a data control signal which controls data in response to the data transmitted through the single data line.

According to a second aspect of the present invention, the pair of complementary data lines and the single data line are a data of a first system, through which data to be output from an amplifier and input in a latch circuit, among a plurality of systems divided by amplifiers and the latch circuits.

According to a third aspect of the present invention, the data control signal is a signal for controlling data holding which controls timing for holding data in the data lines of the first system in the latch circuit.

A fourth aspect of the present invention, the data control signal is a signal for controlling data output which controls timing for outwardly outputting from an output terminal data corresponding to data in a data line of a second system, through which data output from the latch circuits and input in the amplifiers.

According to a fifth aspect of the present invention, a plurality of groups composed of a plurality of single data lines are provided with respect to one pair of complementary data lines.

According to a sixth aspect of the present invention, a circuit for detecting valid data is provided for each of the amplifiers connected to the single data lines and the data control signal controls an output of the corresponding amplifier.

According to a seventh aspect of the present invention, there is provided a semiconductor integrated circuit comprising a pair of complementary data lines through which data mutually complementary are transmitted when valid data are transmitted under ternary control, a single data line through which data of the same system as that of the pair of complementary data lines under binary control are transmitted and a circuit for detecting valid data which confirms arrival of valid data by detecting an event that data transmitted through the pair of complementary data lines change to data mutually complementary and generates a signal for controlling data transmitted through a data line of the subsequent system.

According to an eighth aspect of the present invention, there is provided a semiconductor integrated circuit comprising a plurality of word lines, a plurality of bit lines disposed so as to cross the plurality of word lines, a plurality of memory cells disposed in correspondence with intersections between the plurality of word lines and the plurality of bit lines, a memory cell array block having a plurality of sense amplifiers provided in correspondence with the plurality of bit lines, a plurality of paired i/o lines provided in correspondence with the memory cell array block, a standard pair of complementary data lines which transmits data corresponding to data to be transmitted through a predetermined pair of i/o lines, among the plurality of pairs of i/o lines, by a pair of complementary data lines, a circuit for detecting valid data which detects an event that the data transmitted through the standard pair of complementary data lines become mutually complementary data, a single data line for transmitting data corresponding to data to be transmitted through another pair of i/o lines among the plurality of pairs of i/o lines and a drive circuit which receives a result of the detection by the circuit for detecting valid data, inputs from the single data line and outputs data corresponding to data to be transmitted through the single data line.

According to a ninth aspect of the present invention, the drive circuit is an intermediate latch circuit.

According to a tenth aspect of the present invention, the drive circuit is a main amplifier.

According to an eleventh aspect of the present invention, a plurality of preamplifiers are provided in correspondence with the plurality of pairs of I/O lines and the pair of complementary data lines and the single data line are connected to the output of the corresponding preamplifier.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENT

A detailed explanation will be give of preferred embodiments of the present invention in reference to FIGS. 1 through 31 as follows, wherein the same references are used for the same or the similar portions and description of these portion is omitted.

EMBODIMENT 1

Figure 1:
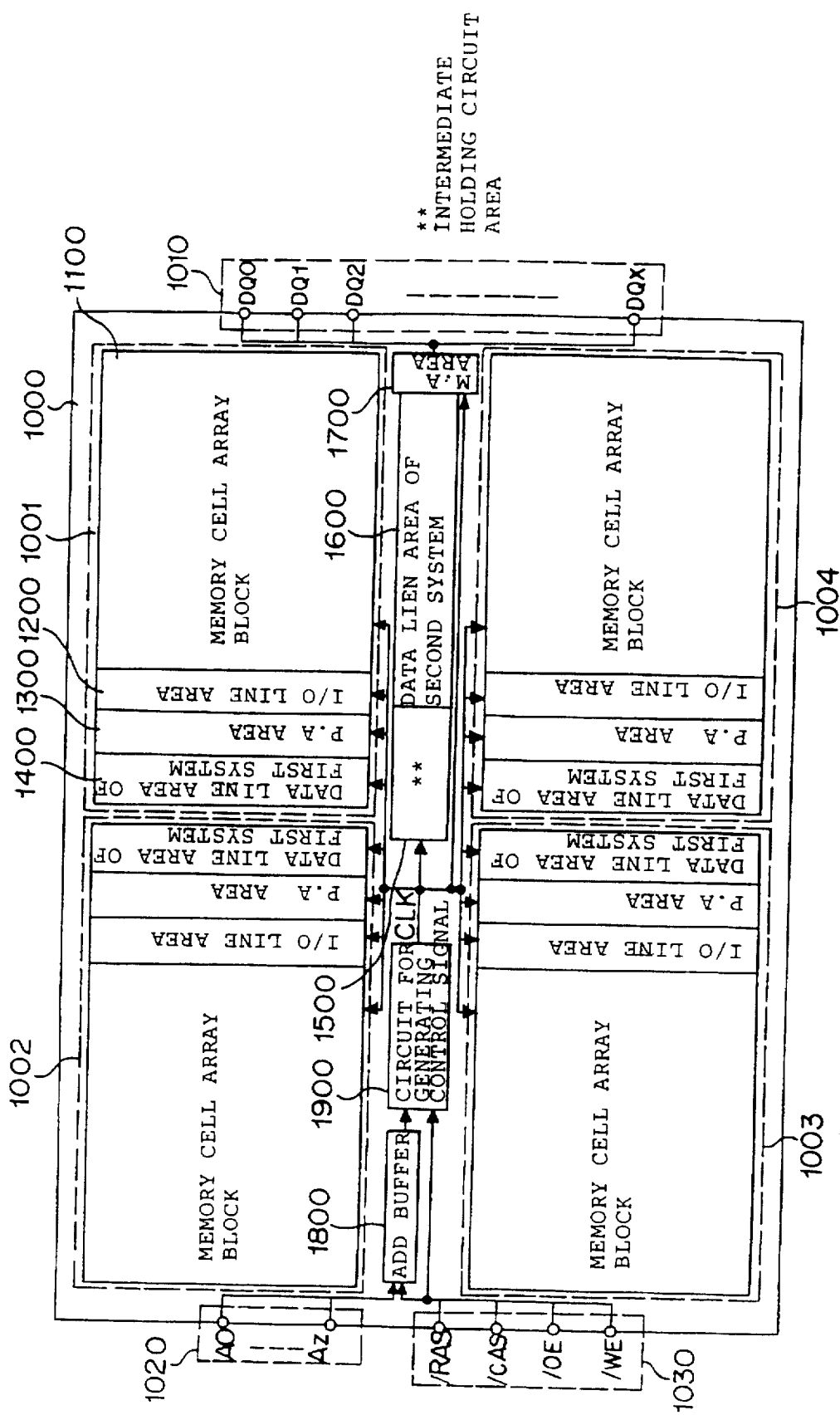
FIG. 1 is a block diagram for showing a configuration of DRAM according to Embodiment 1 of the present invention.

FIG. 1 is a block diagram of dynamic random access memory (DRAM) for showing Embodiment 1 of the present invention. In the Figure, a numerical reference 1000 designates DRAM; and a numerical reference 1100 designates a memory cell array block in which a plurality of word lines (not shown) and a plurality of pairs bit lines (not shown) cross each other in the directions of row and column and memory cells (not shown) are disposed at these intersections, including sense amplifiers (not shown) and so on which are connected to the corresponding pair of bit lines. A numerical reference 1200 designates an I/O line area in which the plurality of pairs of I/O lines connected to the pairs of bit lines and switching circuits (not shown) in the memory cell array block 1100, wherein the I/O line area transmits data in memory cells read out by the pairs of bit lines and amplified by the sense amplifiers, namely valid data. A numerical reference 1300 designates a preamplifier area (hereinbelow, referred to as P.A area) in which a plurality of preamplifiers connected to the corresponding pairs of I/O lines in the I/O line area 1200 for amplifying and outputting to drive the valid data transmitted through the pairs of I/O lines are provided. A numerical reference 1400 designates a data line area of a first system in which a plurality of data lines of the first system connected to the corresponding preamplifiers in the P.A area 1300 for transmitting the valid data amplified by the preamplifiers are wired. Numerical references 1001 through 1004 designate array blocks, which are divided into four blocks in this DRAM according to Embodiment 1. Each of the array blocks 1001 through 1004 has its own memory cell array block, I/O line area, P.A area and data line area of the first system.

A numerical reference 1500 designates an intermediate latch circuit area provided with a plurality of intermediate latch circuits which are connected to data lines in each data line area of the first system in the array blocks 1001 through 1004 and holds the valid data output to drive from the preamplifiers and transmitted through the data lines of the first system and further outputs to drive. A numerical reference 1600 designates a data line area of a second system in which a plurality of data lines of the second system are wired, which lines are connected to the corresponding intermediate latch circuits in the intermediate latch circuit area 1500, transmit the valid data held by the intermediate latch circuits and output to drive are wired. A numerical reference 1700 designates a main amplifier area (hereinbelow, referred to as M.A area) in which a plurality of main amplifiers which are connected to data lines in the data line area of the second system 1600 respectively and outputs to drive the valid data, which are output to drive from the intermediate latch circuits and transmitted through the data lines of the second system, to the outside.

A numerical reference 1010 designates a group of input/output terminals for outputting the valid data output to drive from the main amplifiers to the outside. A numerical reference 1020 designates a group of input terminals of address signals for inputting address signals which designate addresses of memory cells from the outside, wherein the number of these terminals is different depending on a memory bit configuration, a bit capacity or the like of DRAM. A numerical reference 1030 designates a group of terminals for inputting outer control signals including a terminal for inputting a row address strobe signal /RAS which is to introduce addresses in the row direction in the memory cells arranged in the directions of row and column into the inside, a terminal for inputting a column address strobe signal /CAS for introducing addresses in the column direction into the inside thereof, a terminal for inputting an output enabling signal /OE for instructing the output of data from the group of input/output terminals 1010, and a terminal for inputting a write enabling signal /WE which is to write data input from the group of input/output terminals 1010 in memory cells. A numerical reference 1800 designates an address buffer (hereinbelow, referred to as ADD buffer) which transforms the address signals input from the group of input terminals of address signal 1020 into an internal address signal. A numerical reference 1900 designates a circuit for generating control signal for generating internal control signals for controlling various operation in the inside of DRAM in response to outer control signals input from the group of terminals for inputting outer control signal 1030 respectively, which internal control signals are, for example, a preamplifier activation signal PAE for activating the preamplifiers in the P.A area 1300, a signal for controlling data holding which controls timing for holding data by the intermediate latch circuits in the intermediate latch circuit area 1500, a signal for controlling data output OEM which designates an output of data to the outside through the input/output terminals from the main amplifiers in the M.A area 1700 or the like. Hereinbelow, these internal control signals are generally referred to as CLK.

Figure 2:
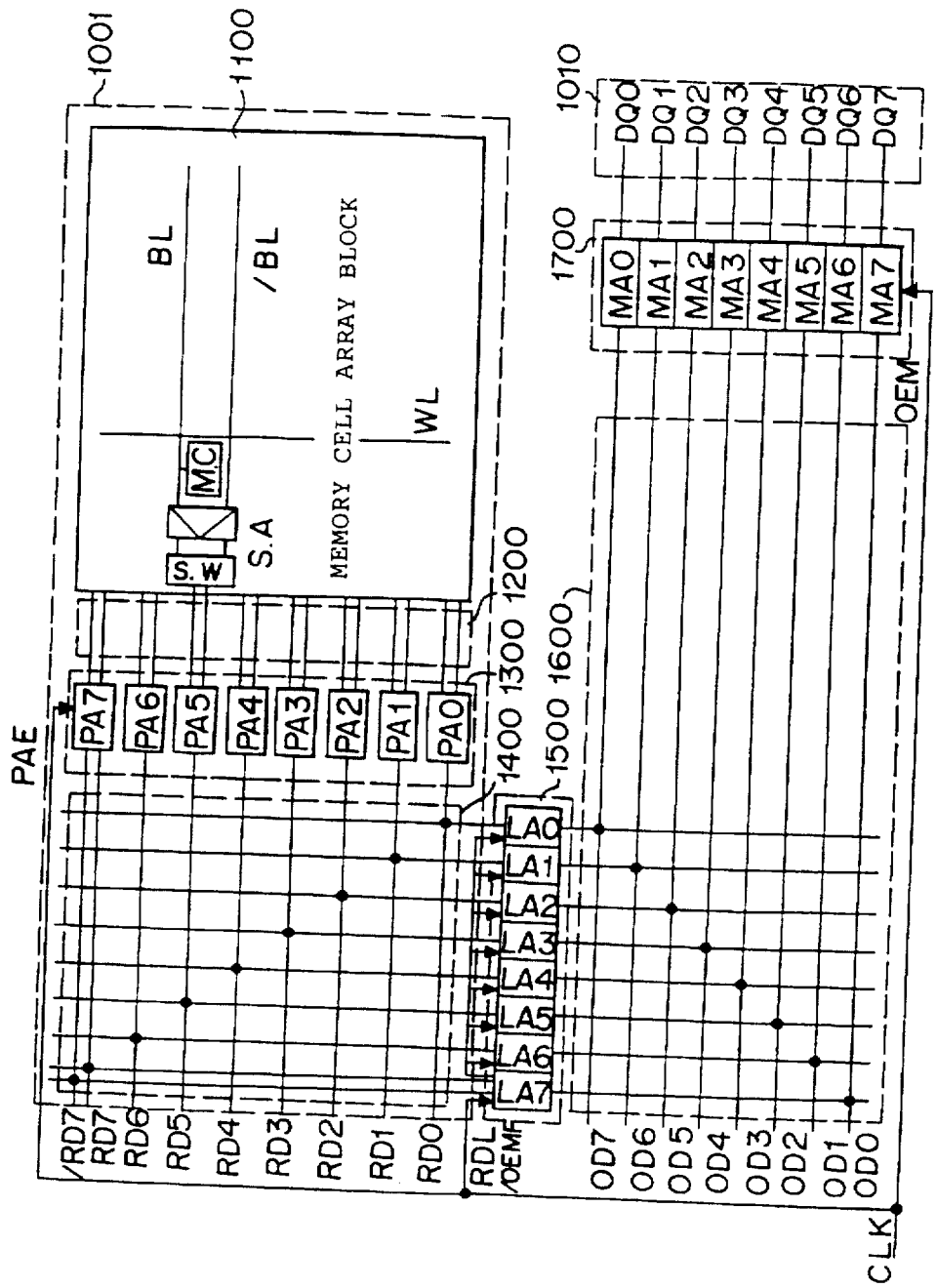
FIG. 2 is a block diagram for showing configurations of one of array blocks in DRAM, an intermediate holding area, a data line area of a second system and a main amplifier area respectively corresponding the DRAM shown in FIG. 1.

FIG. 2 is a block diagram for showing the array block 1001 of the DRAM shown in FIG. 1, a part of the intermediate latch circuit area 1500 corresponding thereto, a part of the data line area of the second system and a part of the M.A area 1700. In FIG. 2, a configuration including eight sets of a pair of I/O lines, a preamplifier, a data line of the first system, an intermediate latch circuit, a data line of the second system, a main amplifier and an input/output terminal so as to be in an one-to-one correspondence is exemplified. In the memory cell array block 1100, a reference WL designates a word line; references BL./BL designate a pair of bit lines; a reference M.C designates a word line; a reference S.A designates a sense amplifier which is connected to the corresponding pair of bit lines; and a reference S.W designates a switching circuit which selectively connects to the pair of bit lines or the pair of I/O lines. Further, in the memory cell array block 1100, memory cells M.C are disposed intersections between the word line WL and the pair of bit lines BL./BL, which lines cross each other in the directions of row and column.

In FIG. 2, eight pairs of I/O lines are wired in the I/O line area 1200 and eight preamplifiers PA0 through PA7 are respectively disposed in correspondence with the pairs of I/O lines. Data in the memory cell M.C read out by the pair of bit lines BL./BL in the memory cell array block 1100 are amplified by the sense amplifier S.A and further amplified by the corresponding preamplifiers via the corresponding pairs of I/O lines. In the data line area of the first system 1400, data lines RD0 through RD7, /RD7 which are connected to the preamplifiers PA0 through PA7 are wired, wherein these data lines transmit the data amplified by the preamplifiers PA0 through PA7. Each of the data lines RD0 through RD6 of the first system which are connected to the preamplifiers PA0 through PA6 is one single data line, wherein these data lines are subjected to binary control using an H level and an L level. The data line of the first system which is connected to the preamplifier PA7 is composed of a pair of complementary data lines RD7./RD7 and subjected to ternary control including combinations as follows: the data line RD7 of the H level and the data line /RD7 of the L level, the data line RD7 of the L level and the data line /RD7 of the H level and the data lines RD7./RD7 of the H level. These data transmitted through the data lines of the first system are held in the intermediate latch circuits LA0 through LA7 which are respectively connected to the data lines RD0 through RD7, /RD7 of the first system, are transmitted through the data lines OD0 through OD7 in the data line area of the second system 1600 respectively connected to the intermediate latch circuits LA0 through LA7, and arrive at the main amplifiers MA0 through MA7 respectively. Thereafter, the outputs from these main amplifiers MA0 through MA7 are output to the outside from the input/output terminals DQ0 through DQ7.

In FIG. 2, a signal for controlling timing for holding the valid data respectively by the intermediate latch circuits LA0 through LA6 is output from the intermediate latch circuit LA7 as a signal for controlling data holding RDL7 because timing for holding the valid data to be transmitted through the single data lines RD0 through RD6 is controlled in response to an event that the valid data are transmitted through a standard pair of complementary data lines, which is the pair of complementary data lines of the first system RD7./RD7, namely, in response to an event that the data in the pair of data lines become mutually complementary.

Figure 3:
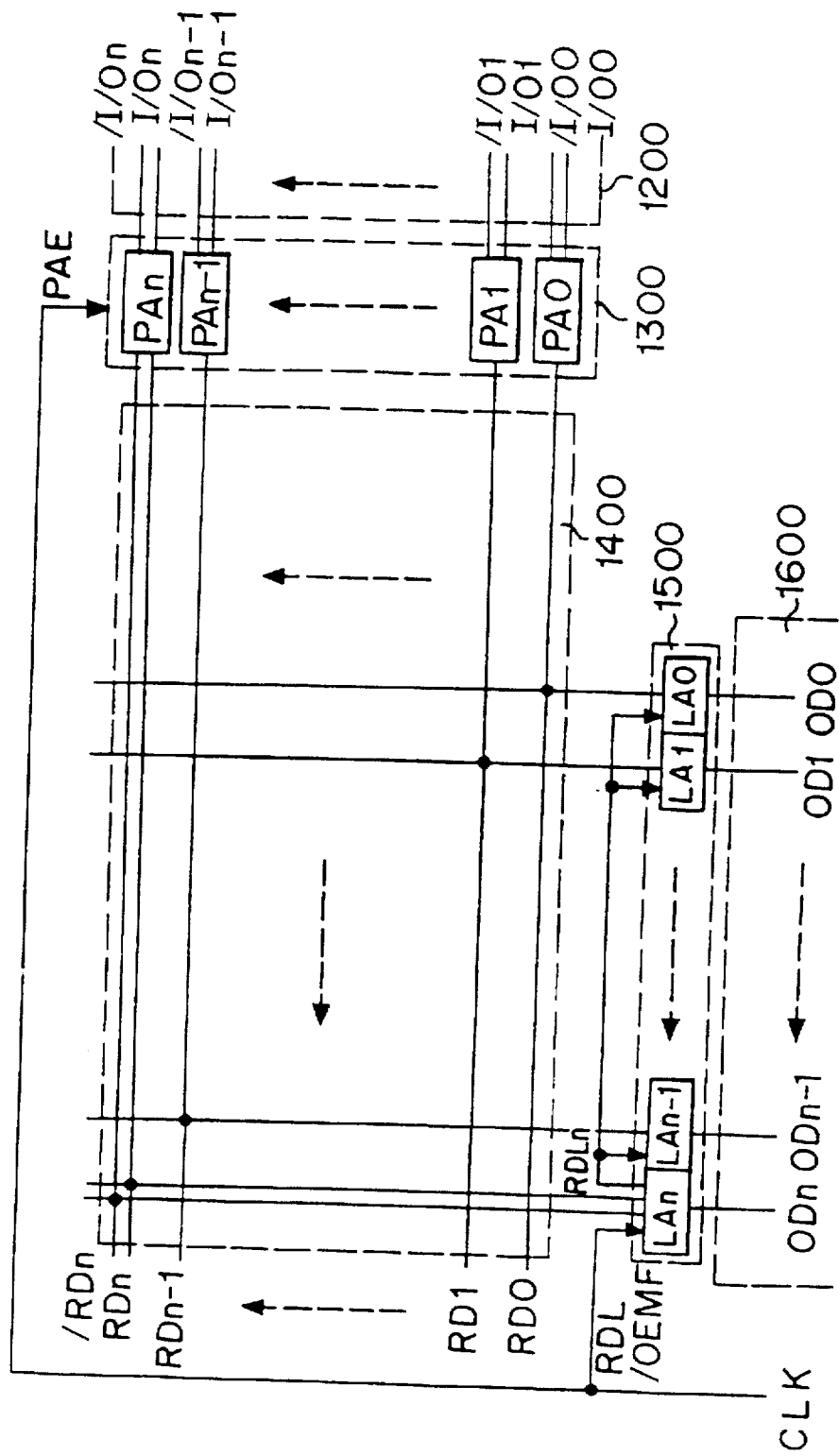
FIG. 3 is a block diagram for showing configurations of a preamplifier area, a data line area of a first system and an intermediate holding area respectively corresponding to one of array blocks in DRAM shown in FIG. 1.

FIG. 3 shows a case that the number of preamplifiers, the intermediate latch circuits and so on is n+1. Embodiment 1 of the present invention will be described specifically based on this Figure. In FIG. 3, there is a standard pair of complementary data lines as a standard in the data line area of the first system 1400; the other data lines of the same system are only single data lines; and the data line area of the second system 1600 is composed of only single data lines.

In FIG. 3, the preamplifier PAn in the P.A area 1300 is connected so as to amplify data transmitted through a pair of I/O lines I/On./I/On and output to the pair of complementary data lines of the first system RDn./RDn. The other amplifiers PA0 through PAn−1 are connected to the single data lines of the first system RD0 through RDn−1. Further, the pair of complementary data lines of the first system RDn./RDn is connected to the intermediate latch circuit LAn, and the other single data lines of the first system RD0 through RDn−1 are connected respectively to the intermediate latch circuits LA0 through LAn−1, wherein outputs from the intermediate latch circuits are connected to the data lines of the second system OD0 through ODn.

Hereinbelow, the pair of complementary data lines of the first system RDn./RDn is referred to as the standard pair of complementary data lines; the preamplifier PAn corresponding thereto is referred to as a standard preamplifier; and the intermediate latch circuit LAn corresponding thereto is referred to as a standard intermediate latch circuit. Further, a reference RDLn is a standard signal for controlling data holding which is output from the standard intermediate latch circuit LAn and controls timing for holding data of the other intermediate latch circuits LA0 through LAn<1.

Figure 4:
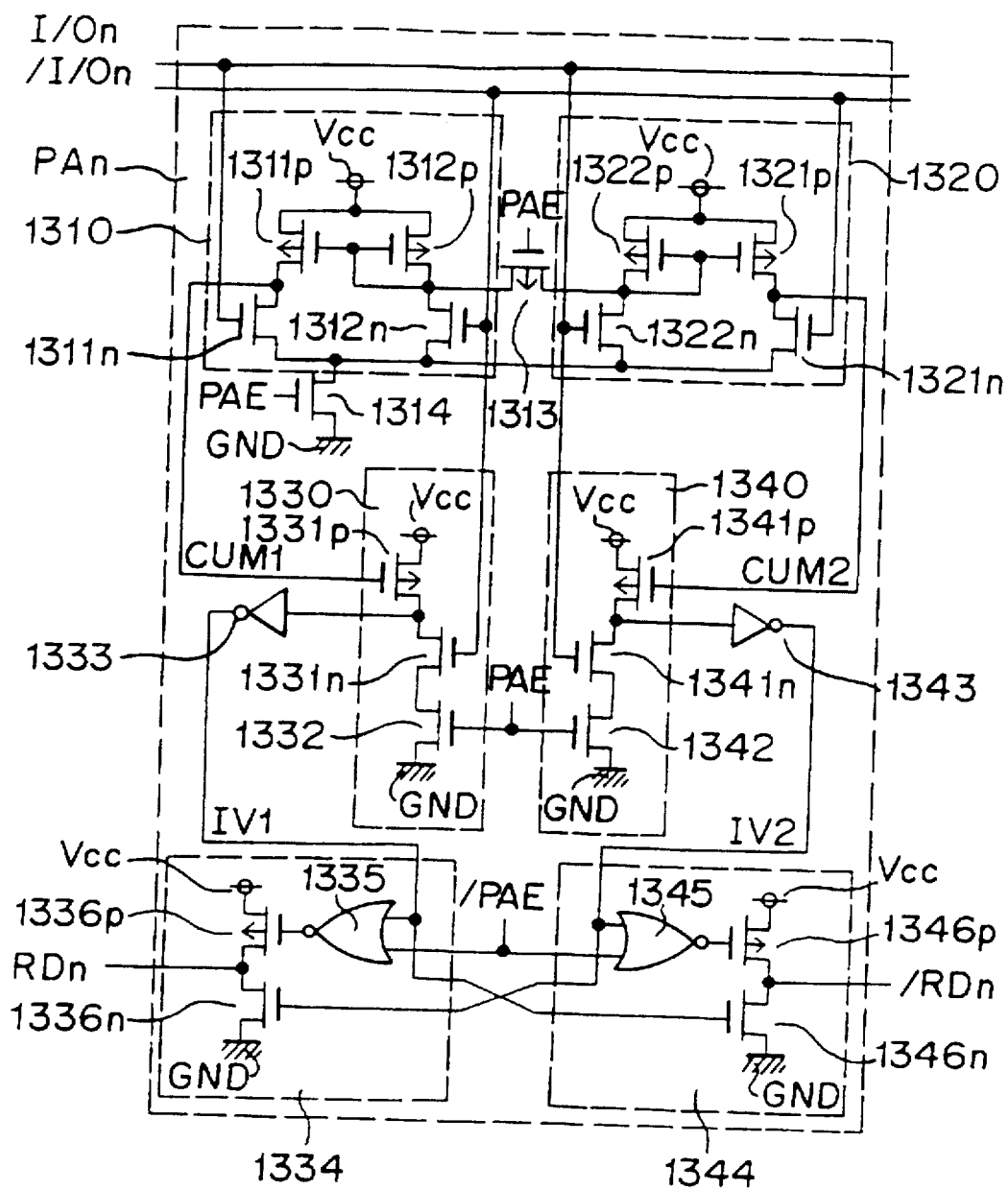
FIG. 4 is a circuit diagram of a standard preamplifier PAn shown in FIG. 3.

FIG. 4 is a circuit diagram of the standard preamplifier PAn shown in FIG. 3. In the Figure, a reference Vcc designates a source electric potential and a reference GND designates a ground electric potential. In FIG. 4, a numerical reference 1310 designates a current mirror type differential amplifier which inputs data coming to the pair of I/O lines I/On./I/On and detects for amplifying a difference between an electric potential of the line I/On and an electric potential of the line /I/On, wherein the differential amplifier is constituted such that the source is connected to the source electric potential Vcc; and two P-channel type transistors 1311p, 1312p of which gates are connected each other and two N-channel type transistors 1311n, 1312n of which gates are respectively connected to the line I/On and the line /I/On are included. A numerical reference 1320 designates a current mirror type differential amplifier similar thereto, wherein this differential amplifier is constituted such that the source is connected to the source electric potential Vcc; and two P-channel type transistors 1321p, 1322p of which gates are connected each other and two N-channel type transistors 1322n, 1321n of which gates are connected respectively to the line I/On and the line /I/On. A numerical reference 1314 designates a N-channel type transistor, wherein the transistor is connected between the differential amplifiers 1310, 1320 and the ground electric potential GND to activate both of the differential amplifiers 1310 and 1320 upon receipt of the preamplifier activation signal PAE in its gate. A numerical reference 1313 designates a P-channel type transistor which is connected between the differential amplifiers 1310 and 1320, receives the preamplifier activation signal PAE in its gate and switches off the differential amplifiers 1310 and 1320 at a time of activating the preamplifier.

A numerical reference 1330 designates an inverter type amplifier in which a P-channel type transistor 1331p receiving an output CUM1 from the differential amplifier 1310 in its gate, an N-channel type transistor 1331n connected to the I/O line /I/On at its gate and an N-channel type transistor for activation 1332 receiving the preamplifier activation signal PAE in its gate are connected in serial between the source electric potential Vcc and the ground electric potential GND. A numerical reference 1333 designates an inverter for generating output waveform for the sake of the inverter type amplifier 1330, wherein the output from the inverter is referred to as IV1.

A numerical reference 1340 designates an inverter type amplifier in which a P-channel type transistor 1341p receiving the output CUM2 from the differential amplifier 1320, an N-channel type transistor 1341n connected to the I/O line I/On at its gate and an N-channel type transistor for activation 1342 receiving the preamplifier activation signal PAE in its gate are connected in serial between the source electric potential Vcc and the ground electric potential GND. A numerical reference 1343 designates an inverter for generating output waveform for the sake of the inverter type amplifier 1340, wherein the output from the inverter is referred to as IV2.

Further, the preamplifier PAn receives the outputs IV1, IV2 from the inverters 1333, 1343 respectively, transmits to output data amplified by the differential amplifiers 1310, 1320 and the inverter type amplifiers 1330, 1340 to the pair of complementary data lines of the first system RDn./RDn, works as a driver for driving the pair of complementary data lines, and includes bus driver circuits 1334, 1344 for precharging both lines of the pair of complementary data lines.

The bus driver circuit 1334 is composed of an NOR gate 1335 of which inputs are the output IV1 from the inverter 1333 and a reverse signal /PAE of the preamplifier activation signal PAE and two transistors connected in serial between the source electric potential Vcc and the ground electric potential GND, namely a P-channel type transistor 1336p receiving the output from the NOR gate 1335 in its gate and an N-channel type transistor 1336n receiving the output IV2 from the inverter 1341 in its gate The bus driver circuit 1344 is composed of an NOR gate 1345 of which inputs are the output IV2 from the inverter 1343 and the reverse signal/PAE of the preamplifier activation signal PAE and two transistors connected in serial between the source electric potential Vcc and the ground electric potential GND, namely a P-channel type transistor 1346p receiving the output from the NOR gate 1345 in its gate and an N-channel type transistor 1346n receiving the output IV1 from the inverter 1333 in its gate.

Figure 5:
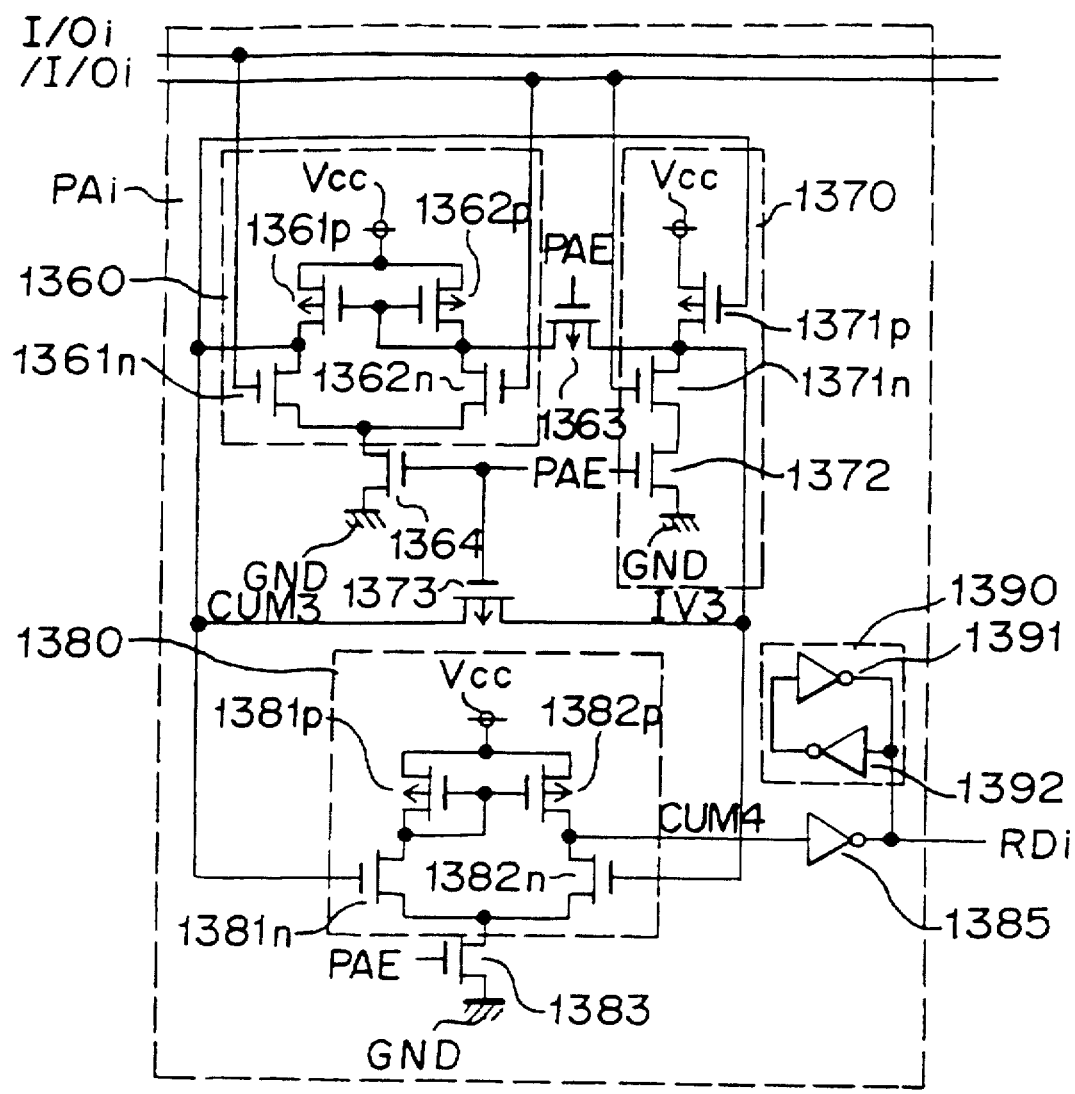
FIG. 5 is a circuit diagram of preamplifiers PA0 through PAn-1 shown in FIG. 3.

FIG. 5 shows a preamplifier corresponding to the preamplifiers PA0 through PAn−1 other than the standard preamplifier PAn shown in FIG. 3, where the suffix i designates any one of 0 through n−1. A numerical reference 1360 designates a current mirror type differential amplifier which inputs from the pair of I/O lines and detects for amplifying an electric potential appears between the I/Oi line and the /I/Oi line, wherein it is composed of two P-channel type transistors 1361p, 1362p, of which sources are connected to the source electric potential and gates are connected each other, and two N-channel type transistors 1361n, 1362n, of which gates are connected respectively to the I/Oi line and the /I/Oi line. A numerical reference 1364 designates an N-channel type transistor which is connected between the differential amplifier 1360 and the ground electric potential GND, and receives the preamplifier activation signal PAE in its gate, for activating the differential amplifier 1360.

A numerical reference 1370 designates an inverter type amplifier in which a P-channel type transistor 1371p receiving the output CUM3 from the differential amplifier 1360 in its gate, an N-channel type transistor 1371n connected to the I/O line /I/Oi at its gate and an N-channel type transistor for activation 1372 receiving the preamplifier activation signal PAE in its gate are connected in serial between the source electric potential Vcc and the ground electric potential GND.

A numerical reference 1363 designates a P-channel transistor which is connected between the differential amplifier 1360 and the inverter type amplifier 1370, receives the preamplifier activation signal PAE in its gate and separates the amplifiers 1360 and 1370 at a time of activating the preamplifier. A numerical reference 1373 designates a P-channel type transistor, which is connected between the output CUM3 from the differential amplifier 1360 and the output IV3 from the inverter type amplifier 1370, receives the preamplifier activation signal PAE in its gate and equalizes CUM3 and IV3 when the preamplifier is deactivated.

A numerical reference 1380 is a current mirror type differential amplifier which inputs the output CUM3 from the differential amplifier 1360 and the output IV3 from the inverter amplifier 1370 and detects a difference of electric potentials between these, wherein it is composed of two P-channel type transistors 1381p, 1382p, of which sources are connected to the source electric potential Vcc and of which gates are connected each other, and two N-channel type transistors 1381n, 1382n, of which gates are connected respectively to the output CUM3 from the differential amplifier 1360 and the output IV3 from the inverter type amplifier 1370. A numerical reference 1383 designates an N-channel type transistor which is connected between the differential amplifier 1380 and the ground electric potential GND, receives the preamplifier activation signal PAE in its gate, and activates the differential amplifier 1380.

A numerical reference 1385 designates an inverter which transmits to output the output CUM4 from the differential amplifier 1380 to the single data line of the first system RDi and drives this single data line. A numerical reference 1390 designates a latch circuit which holds the output from the inverter 1385 composed of inverters 1391 and 1392.

Figure 6:
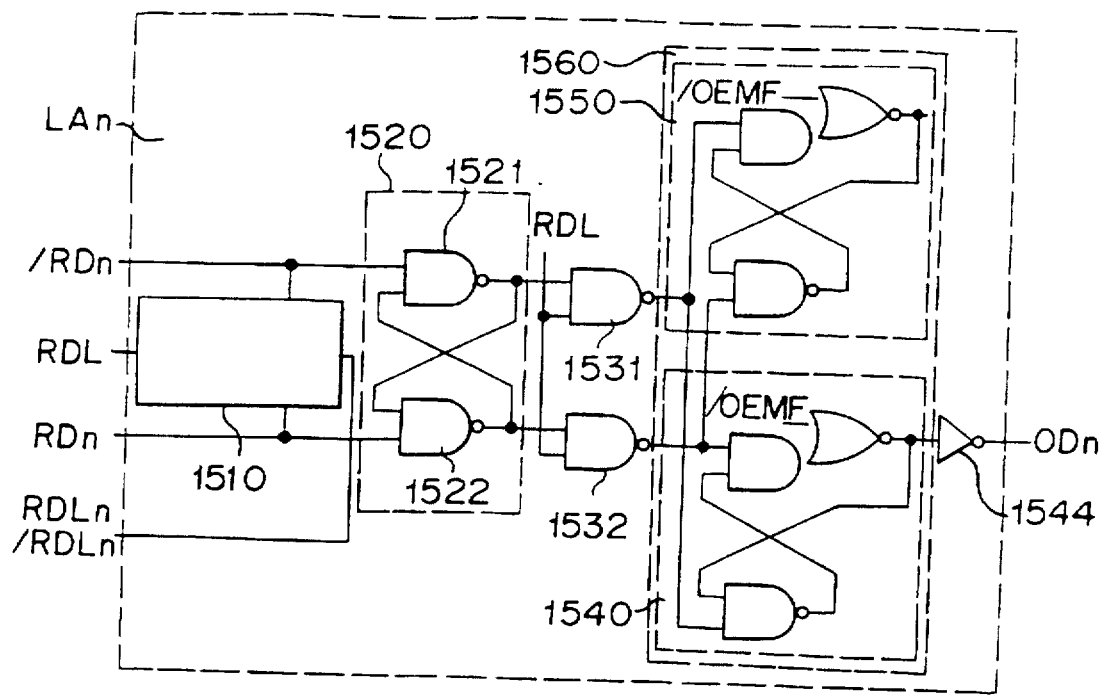
FIG. 6 is a circuit diagram of a standard intermediate latch circuit LAn shown in FIG. 3.

FIG. 6 is a circuit diagram of the standard intermediate latch circuit LAn connected to the standard pair of complementary data lines RDn./RDn shown in FIG. 3. In the Figure, a numerical reference 1510 designates a circuit for detecting valid data which detects an event that data transmitted through the standard pair of complementary data lines RDn./RDn become complementary to each other and outputs the standard signal for controlling data holding RDLn which controls timing for holding data in the other intermediate latch circuits LA0 through LAn–1. A numerical reference 1520 designates a latch circuit, wherein when the valid data are transmitted through the standard pair of complementary data lines RDn./RDn and become complementary to each other, it intakes the data and outputs reversely. This latch circuit is composed of NAND gates 1521 and 1522 wherein even after the standard pair of complementary data lines RDn./RDn are precharged and become the H level, it maintain the data output obtained before the pre-charge. Numerical references 1531 and 1532 designate NAND gates which input the outputs from the latch circuit 1520 and the signal for controlling data holding RDL from the standard intermediate latch circuit LAn.

A numerical reference 1560 designates a circuit which receives a signal /OEMF to be activated at timing earlier than the outputs from the NAND gates 1531 and 1532 and the output control signal OEM input in the main amplifier, and, when the valid data transmitted through the pair of data lines of the first system RDn./RDn becomes complementary to each other as the outputs from the NAND gates 1531 and 1532, holds the data automatically. A numerical reference 1540 designates a composite gate for holding the valid data transmitted through the data line RDn, which is one of the pair of data lines of the first system output from the NAND gate 1532. A numerical reference 1550 designates a composite gate for holding the valid data transmitted through the data line /RDn, which is the other of the paired data lines of the first system output from the NAND gate 1531.

A numerical reference 1544 designates an inverter which reverses the output from the composite gates 1560 and drives a data line of the second system ODn. Further, when the reference /OEMF input in the composite gates 1560 is deactivated (i.e. in the H level), the data line of the second system ODn is pre-charged.

As described in the above, the latch circuit 1520 and the composite gates 1560 in the intermediate latch circuit are a circuit for controlling efficiently three kinds of state, which are data line RDn of the H level and the data line /RDn of the L level, the data line RDn of the L level and the data line /RDn of the H level and the data lines RDn and /RDn of the H level, by avoiding a loss of time as much as possible.

Figure 7:
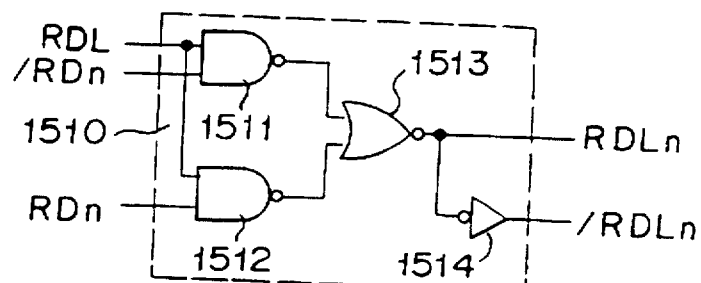
FIG. 7 is a circuit diagram of a valid data detecting circuit shown in FIG. 6.

FIG. 7 is a circuit diagram of the circuit for detecting valid data 1510 shown in FIG. 6. In FIG. 7, numerical references 1511 and 1512 are NAND gates which input data transmitted through the standard pair of complementary data lines RDn./RDn and the signal for controlling data holding RDL. A numerical reference 1513 designates an NOR gate which input the outputs from the NAND gates 1511 and 1512, wherein the NOR gate outputs the L level when data transmitted through the standard pair of complementary data lines RDn./RDn become complementary to each other at a time, when the signal for controlling data holding RDL, which makes the intermediate latch circuit in a state of enabling to intake data transmitted through the pair of data lines of the first system RDn./RDn, is in the H level. This output is the standard signal for controlling data holding RDLn which controls timing for holding data from the intermediate latch circuits LA0 through LAn–1 other than the standard intermediate latch circuit LAn, namely the other intermediate latch circuits, wherein the reverse signal /RDLn is output from an inverter 1514.

Figure 8:
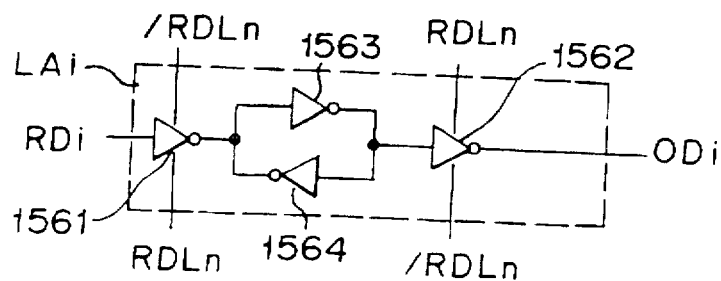
FIG. 8 is a circuit diagram of intermediate latch circuits LA0 through LAn-1 shown in FIG. 3.

FIG. 8 is a circuit diagram of the intermediate latch circuits LA0 through LAn–1 other than the standard intermediate latch circuit LAn, wherein this circuit is referred to as LAi. Hereinbelow, the suffix i designates any value of 0 through n–1 as mentioned in the case of preamplifier. A numerical reference 1561 designates a clocked inverter on an input side which inputs data transmitted through a single data line RDi other than the standard pair of complementary data lines of the first system RDn./RDn and controls a transfer of the input data by the standard signals for controlling data holding RDLn./RDLn output from the circuit for detecting valid data 1510 shown in FIGS. 6 and 7. Numerical references 1563 and 1564 designate inverters, which composes a latch circuit for holding data taken in the intermediate latch circuit LAi by the clocked inverter on the input side 1561, wherein the output from the latch circuit is transferred to the data line of the second system ODi by a clocked inverter on an output side 1562. The clocked inverter on the output side is in a transmittable state at a phase reverse to that of the clocked inverter on the input side 1561 controlled by the standard signals for controlling data holding RDLn./RDLn. The data line of the second system ODi is driven by the clocked inverter on the output side 1562.

The clocked inverter 1561 works as an inverter when the standard signal for controlling data holding RDLn is in the H level and the standard signal for controlling data holding /RDLn in the L level. In other words, data in the data line RDi are reversely output. On the other hand, the clocked inverter 1562 works as an inverter when the standard signal for controlling data holding RDLn is in the L level and the standard signal for controlling data holding/RDLn is in the H level. In other words, data in the latch circuit composed of the inverters 1563 and 1564 are reversely output.

As described in the above, the intermediate latch circuit shown in FIG. 8 has a circuit for controlling two kinds of state, namely, the data line RDi of the H level and the data line RDi of the L level. Further, a transfer gate can be used instead of the clocked inverter on the input side and the clocked inverter of the output side.

Figure 9:
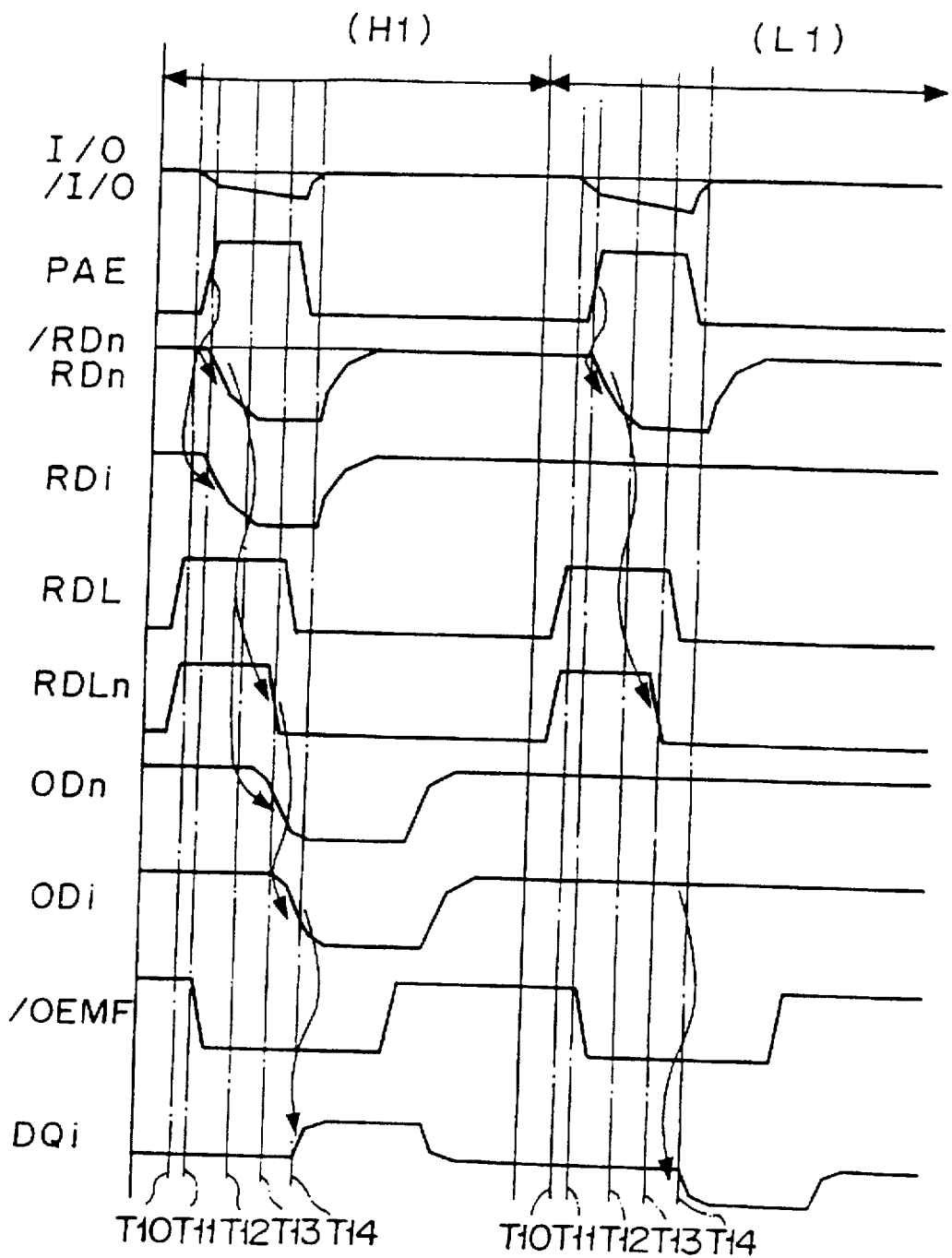
FIG. 9 is timing chart for showing an operation of DRAM according to Embodiment 1 of the present invention.

In the next, an operation will be described in detail. FIG. 9 is a timing chart for showing the operation according to Embodiment 1.

References I/O, /I/O designate data in the memory cell transmitted to a pair of I/O lines through the sense amplifier. In this example, the identical data are read out to the pair of I/O lines suffixed by 0 through n. A reference PAE designates a preamplifier activation signal; references RDn./RDn designate data transmitted through a standard pair of complementary data lines of the first system; a reference RDi designates data transmitted through one of single data lines of the first system RDi; a reference RDL designates a signal for controlling data holding in the standard intermediate latch circuit LAn; a reference RDLn designates a standard signal for controlling data holding which is output from the standard intermediate latch circuit LAn and input in the intermediate latch circuits LAi other than the standard intermediate latch circuit LAn; a reference ODn designates data transmitted through the data line of the second system ODn which is the output from the standard intermediate latch circuit LAn; a reference ODi designates data transmitted through the data line of the second system ODi output from the intermediate latch circuit LAi, which circuit is controlled by the standard signal for controlling data holding RDLn; a reference /OEMF designates a signal for precharging the output from the standard intermediate latch circuit LAn; and a reference DQi designates data output from an input/output terminal DQi. In this timing chart, identical data are output with respect to the suffixes 0 through n. In FIG. 9, a reference (H1) designates a case that data output from the input/output terminal DQi is in the H level and a reference (L1) designates a case that data output from the input/output terminal DQi is in the L level.

Data in a memory cell positioned in an address designated at a time T10 appear in the pair of I/O lines through the pair of bit lines and the sense amplifiers. Hereinbelow, these data are referred to as valid data.

When the preamplifier activation signal PAE becomes at the H level at a time T11 and thereby the preamplifiers are activated, the differential amplifiers 1310 and 1320 of the standard preamplifier PAn shown in FIG. 4 are cut off by the P-channel type transistor 1313 and the N-channel type transistor 1314 is conducted to thereby activate the differential amplifiers 1310 and 1320. The differential amplifiers 1310 and 1320 compare valid data respectively appear in the I/On line and the /I/On line and output results of the comparison to CUM1 and CUM2. In this, data appear in the /I/On line is at a lower level than data appears in the I/O line. Therefore, the N-channel type transistor 1311n is in a stronger conducting state than that of the N-channel type transistor 1312n, whereby the result of the comparison CUM1 has a value approximates to the L level, and the N-channel type transistor 1321n of the differential amplifier 1320 becomes in a weaker conducting state than that of the N-channel type transistor 1322n, whereby the result of comparison CUM2 becomes a value approximates to the H level.

In the next, the inverter type amplifier 1330 activated by the preamplifier activation signal PAE amplifies the result of the comparison CUM1 and data appear in the /I/On line. Since the result of the comparison CUM1 has a value approximates to the L level and the valid data appear in the /I/On line has a value approximates to the L level, the P-channel type transistor 1331p becomes in a stronger conducting state than that of the N-channel type transistor 1331n, whereby the output from the inverter type amplifier 1330 has a value approximates to the H level. This output is transformed to be a waveform by the inverter 1333 and the L level is output to a result of amplification IV1 in a second stage. On the other hand, the inverter type amplifier 1340 activated in advance by the preamplifier activation signal PAE amplifies the result of the comparison CUM2 and the valid data appear in the I/On line. Since the result of the comparison CUM2 is a value approximates to the H level and the valid data appear in the I/On line have a value approximates to the H level, the N-channel type transistor 1341n is in a stronger conducting state than that of the P-channel type transistor 1341p, whereby the output from the inverter type amplifier 1340 has a value further approximates to the L level. This output is transformed to be a waveform by the inverter 1343 and the H level is output to a result of amplification IV2 in the second stage.

These results of amplification IV1 and IV2 are input in the N-channel type transistors 1336n, 1346n and the NOR gates 1335, 1345 respectively. The outputs therefrom are input in the gates of the P-channel type transistors 1336p, 1346p, whereby the L level is output to drive to the data line of the first system RDn and the H level is output to drive to the data line /RDn.

Meanwhile, in the preamplifiers PAi other than the standard preamplifier PAn, the differential amplifier 1360 and the inverter type amplifier 1370 are cut off by the P-channel type transistor 1363 in response to the valid data appear in the pair of I/O lines I/Oi, /I/Oi at the time T10 when the preamplifier activation signal PAE is in the H level at the time T11. Further, the differential amplifier 1360 is activated upon conducting of the N-channel type transistor 1364 and the inverter type amplifier 1370 is activated upon conducting of the N-channel type transistor 1372. The differential amplifier 1360 compares the valid data appear in the I/Oi line and the /I/Oi line and a result of the comparison is output to CUM3. In here, the data appear in the /I/Oi line is at a lower level than that of the data appear in the I/Oi line as in the pair of I/O lines I/On, /I/On. Therefore, the N-channel type transistor 1361n of the differential amplifier 1360 is in a stronger conducting state than that of the N-channel type transistor 1362n, whereby the result of the comparison CUM3 becomes at the L level.

In the next, the inverter type amplifier 1370 amplifies the result of the comparison CUM3 and the valid data appear in the /I/Oi line. Since the result of the comparison CUM3 has a value approximates to the L level and the valid data appear in the /I/Oi line has a value approximates to the L level, the P-channel type transistor 1371p is in a stronger conducting state than that of the N-channel type transistor 1371n and the output IV3 from the inverter type amplifier 1370 has a value approximate to the H level. Further, the result of the comparison CUM3 and the result of the amplification IV3 by the inverter type amplifier 1370 are compared by the differential amplifier 1380. Now, a value approximates to the L level of the output CUM3 from the differential amplifier 1360 is input in the gate of the N-channel type transistor 1381n of the differential amplifier 1380, and a value approximates to the H level of the output IV3 of the inverter type amplifier 1370 is input in the gate of the N-channel type transistor 1382n. Therefore, the N-channel type transistor 1381n of the differential amplifier 1380 is in a weaker conducting state than that of the N-channel type transistor 1382n, whereby the result of the comparison CUM4 outputs a value approximates to the H level. This output is inverted by the inverter 1385 and the L level is output to drive to the single data line of the first system RDi. Further, these data are held in the latch circuit 1390 composed of the inverters 1391 and 1392.

Meanwhile, in the circuit for detecting valid data 1510 of the standard intermediate latch circuit LAn shown in FIG. 7, when the signal for controlling data holding RDL is at the L level, both of the outputs from the NAND gates 1511 and 1512 become at the H level and the output from the NOR gate 1513, namely the standard signal for controlling data holding RDLn, becomes at the L level. In the next, when the signal for controlling data holding RDL is at the H level, both of data in the standard pair of complementary data lines RDn./RDn are at the H level before the valid data appear, whereby both of the outputs from the NAND gates 1511, 1512 become at the L level and the output from the NOR gate 1513, namely the standard signal for controlling data holding RDLn is at the H level. The clocked inverter on the input side 1561 of the intermediate latch circuit LAi shown in FIG. 8 is in a state for taking data transmitted through the single data line of the first system RDi in the latch circuit composed of the inverters 1563 and 1564 upon receipt of the standard signal for controlling data holding RDLn.

At a time T12, data appear in the standard pair of complementary data lines RDn./RDn become complementary data, in other words, valid data appear in the standard pair of complementary data lines. Then, the valid data appear in the data line RDn are at the L level, and the valid data appear in the other data lines/RDn are at the H level. The standard intermediate latch circuit LAn shown in FIG. 6 takes the complementary valid data in the latch circuit composed of the NAND gates 1521 and 1522 upon receipt of the valid data, whereby the output from the NAND gate 1521 is at the L level and the output from the NAND gate 1522 is at the L level. Now, since the signal for controlling data holding RDL is at the H level, the complementary data are inverted by the NAND gates 1531, 1532 and transmitted to the latch circuit 1560. Further, since the pre-charge signal /OEMF is always at the L level, the data are automatically held in the composite gates 1550, 1540 respectively and simultaneously inverted by the inverter 1544 to thereby output to drive the L level to the data line of the second system ODn.

At a time T13, the circuit for detecting valid data 1510 shown in FIG. 7 detects an even that data in the standard pair of complementary data lines RDn./RDn become complementary. In other words, it detects an arrival of the valid data in the standard intermediate latch circuit in which the circuit for detecting valid data 1510 is disposed. At first, the H level is output by anyone of the outputs from the NAND gates 1511 and 1512. The NAND gate outputting the H level is one which receives the L level in its input. In this case, RDn of the pair of complementary data lines becomes at the H level and the output from the NAND gate 1512 becomes at the H level. In response thereto, the standard signal for controlling data holding RDLn output from the NOR gate 1513 becomes at the L level. Further, /RDLn inverted by the inverter 1514 becomes at the H level. On the other hand, during a period while the standard signal for controlling data holding RDLn is at the H level, the valid data transmitted through the single data line RDi are taken in the latch circuit of the intermediate latch circuit LAi through the clocked inverter on the input side 1561. When the standard signals for controlling data holding RDLn and /RDLn become the L level and the H level respectively, which signals are outputs from the circuit for detecting valid data 1510 in the standard intermediate latch circuit LAn, the clocked inverter on the input side 1561 of the other intermediate latch circuit LAi does not intake data transmitted through the data line of the first system RDi; and the clocked inverter on the output side, which can perform an inverter operation in the opposite phase, inverts the data held in the latch circuit and outputs to drive to the data line of the second system ODi.

At a time T14, the valid data transmitted through the data lines of the second system ODn, ODi respectively arrive at corresponding main amplifiers and further output from the input/output terminals DQn, DQi. The period represented by (L1) shown in FIG. 9 designates a case that data output from the input/output terminals DQn, DQi are at the L level, namely, a case that the valid data appear in the pair of I/O lines from the memory cell through the bit lines and the sense amplifier are opposite, wherein the operation at the times T11 through T14 are similar to those in (H1).

As described in the above, the circuit for detecting valid data 1510 in the standard intermediate latch circuit LAn detects an event that the valid data transmitted through the standard pair of complementary data lines of the first system RDn./RDn subjected to ternary control, whereby the valid data transmitted through the other single data lines of the first system, which is subjected to binary control, is held in the corresponding intermediate latch circuits LA0 through LAn-1 and timing for outputting the valid data is controlled by the signal RDLn which corresponds to the detecting signal.

Figure 10:
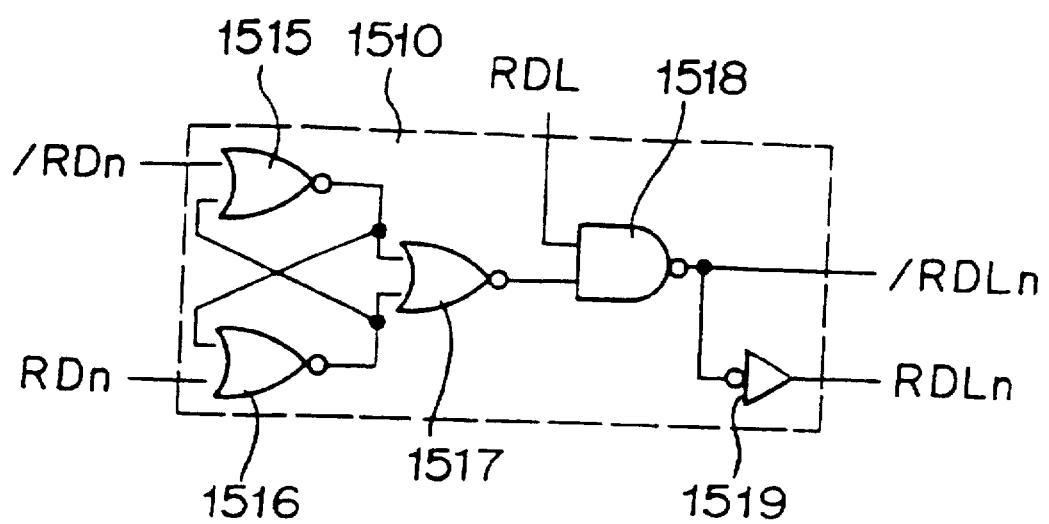
FIG. 10 is a circuit diagram for showing another example of the valid data detecting circuit shown in FIG. 7.

FIG. 10 is a circuit diagram for showing another example of the circuit for detecting valid data 1510 In the Figure, numerical references 1515, 1516 and 1517 designate NOR gates; a reference numeral 1518 designates an NAND gate; and a numerical reference 1519 designates an inverter. When both of data in the standard pair of complementary data lines RDn./RDn are at the H level, both of the outputs from the NOR gates 1515 and 1516 are at the L level and the output from the NOR gate 1517 is at the H level. In response to an event that the signal for controlling data holding RDL becomes at the H level, the output from the NAND gate 1518 is changed from the H level to the L level, and the standard signal for controlling data holding RDLn becomes at the H level because the output from the NAND gate 1518 is inverted by the inverter 1519. In the next, when data in the standard pair of complementary data lines RDn./RDn become complementary, one of the NOR gates 1515, 1516 outputs the H level; the NOR gate 1517 outputs the L level upon receipt of the H level; the NAND gate 1518 outputs the H level; and the inverter 1519 outputs the L level.

EMBODIMENT 2

Figure 11:
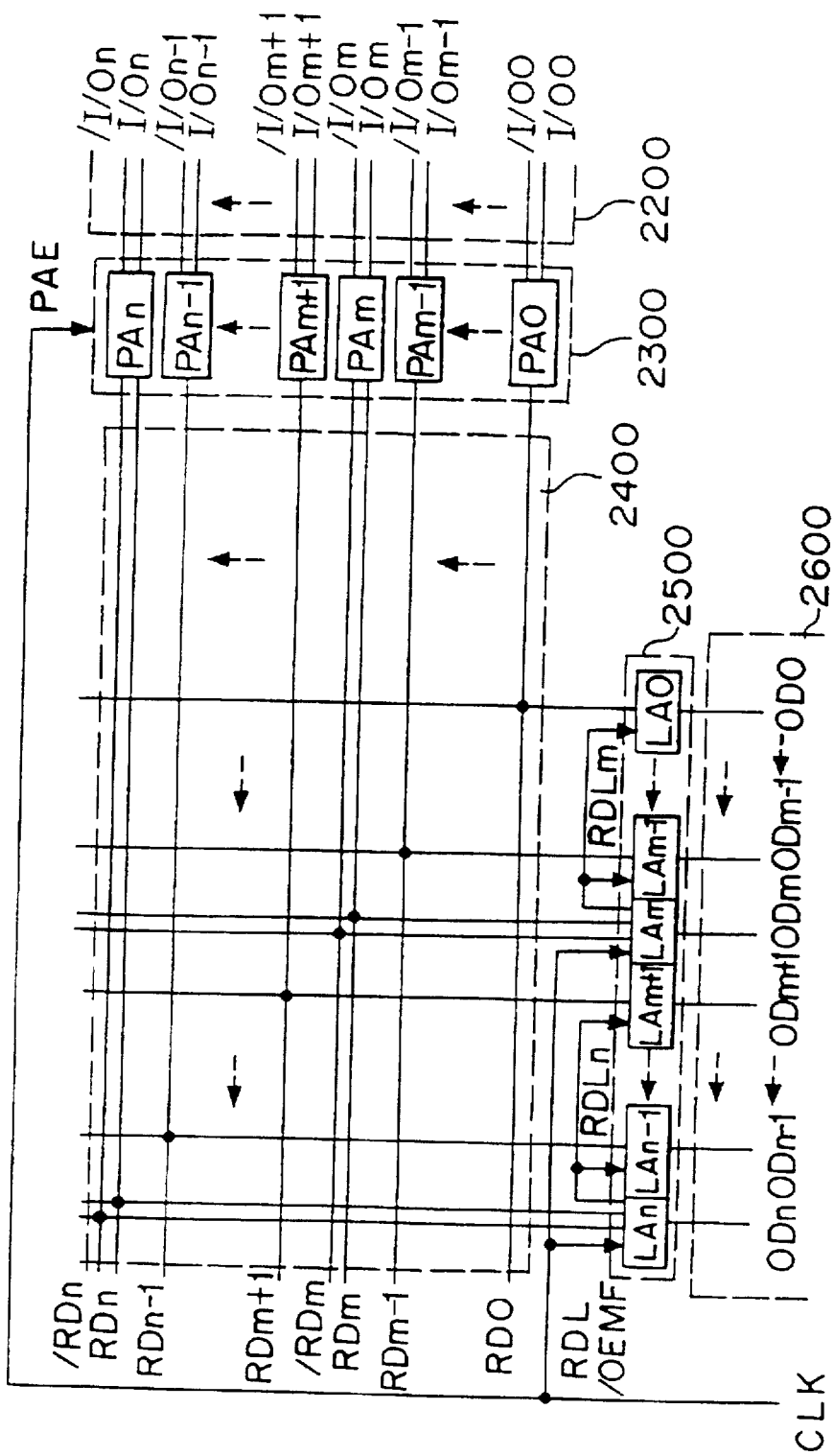
FIG. 11 is a block diagram for showing configurations of a preamplifier area, a data line area of a first system and an intermediate latch circuit area in accordance with Embodiment 2 of the present invention.

FIG. 11 is a block chart for showing Embodiment 2 of the present invention. In the structure described in Embodiment 1, a standard pair of complementary data lines is provided in n+1 pairs of data lines of the first system in one array block. However, in FIG. 11, two standard pairs of complementary data lines are provided in n+1 pairs of data lines of the first system. A numerical reference 2200 designates an I/O line area; a numerical reference 2300 designates a P.A area; a numerical reference 2400 designates a data line area of the first system; a numerical reference 2500 designates an intermediate latch circuit area; and a numerical reference 2600 designates a data line area of the second system.

In Embodiment 2, references PAn and PAm designate standard preamplifiers; references RDn./RDn and RDm./RDm designate standard pairs of complementary data lines of the first system; and references LAn. LAm designate standard intermediate latch circuits. The intermediate latch circuits LA0 through LAm−1 are controlled by a standard signal for controlling data holding RDLm output from the standard intermediate latch circuit LAm, and the intermediate latch circuits LAm+1 through LAn−1 are controlled by a standard signal for controlling data holding RDLn output from the standard intermediate latch circuit LAn. Details of the circuits and operation thereof are similar to those described in Embodiment 1.

It is also possible to further increase the number of standard pair of complementary data lines. Further, it is also possible to provide the standard pair of complementary data lines commonly with respect to a plurality of array blocks.

EMBODIMENT 3

Figure 12:
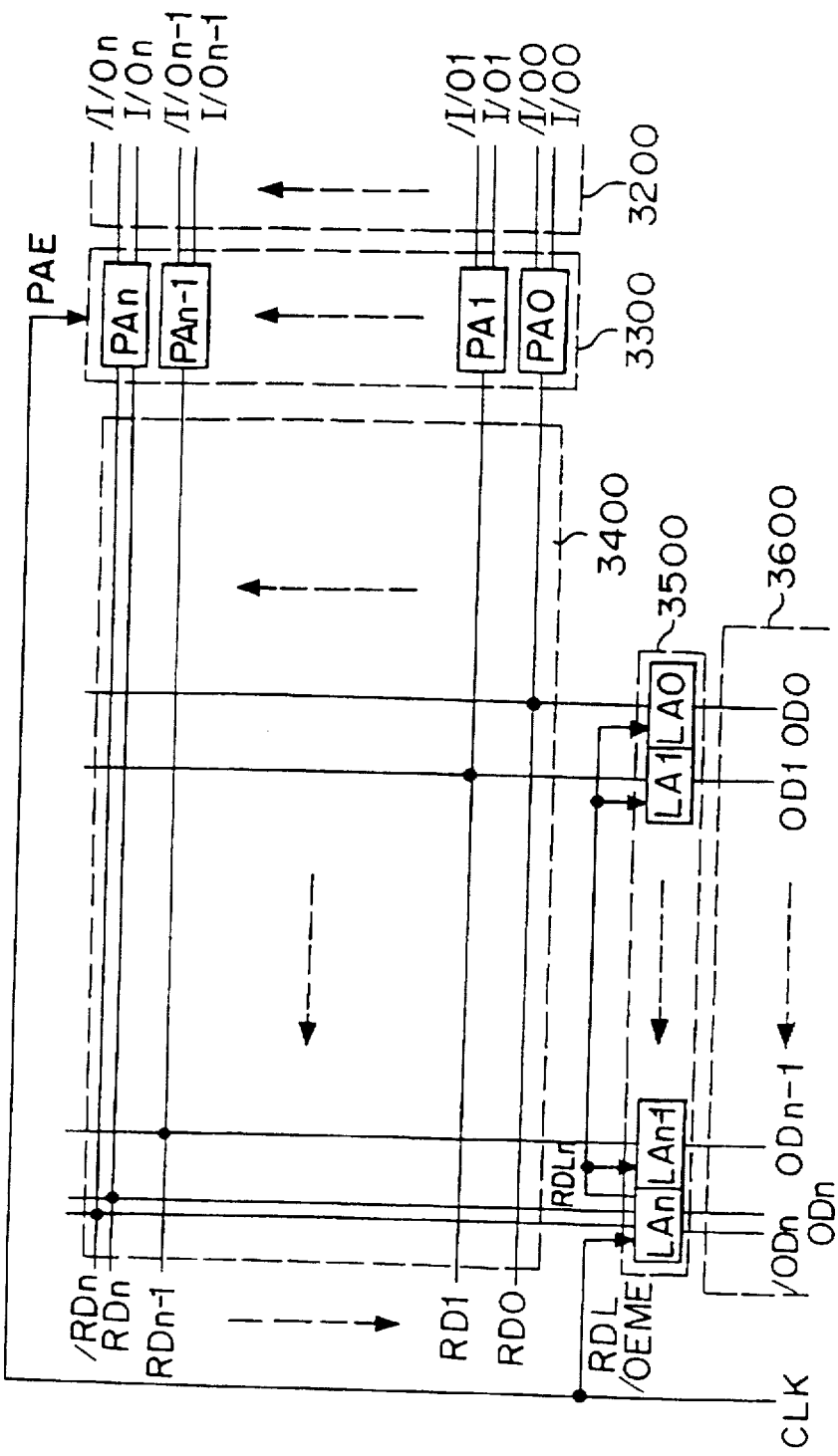
FIG. 12 is a block diagram for showing configurations of a preamplifier area, a data line area of a first system and an intermediate latch circuit area in accordance with Embodiment 3 of the present invention.

FIG. 12 is a block chart for showing Embodiment 3 of the present invention. In the structure shown in Embodiment 1, the data line of the second system output from the standard intermediate latch circuit LAn is a single data line. However, in FIG. 12, only data lines of the second system output from the standard intermediate latch circuit LAn are composed of a pair of complementary data lines. A numerical reference 3200 designates an I/O line area; a numerical reference 3300 designates a P.A area; a numerical reference 3400 designates a data line area of the first system, a numerical reference 3500 designates an intermediate latch circuit area; and a numerical reference 3600 designates a data line area of the second system.

In Embodiment 3, a reference PAn designates a standard preamplifier; references RDn./RDn designate a standard pair of complementary data lines of the first system; and a reference LAn designates a standard intermediate latch circuit, wherein the data line of the second system output from the standard intermediate latch circuit LAn is composed of a pair of complementary data lines ODn./ODn. In other words, the output from the composite gate 1550 is output to drive to the data line /ODn by a newly provided inverter for outputting to drive, in response to an event that the output from the composite gate 1540 of the standard intermediate latch circuit LAn shown in FIG. 6 is output to drive to the data line ODn. Details of circuits and operation thereof are similar to those described in Embodiment 1.

EMBODIMENT 4

Figure 13:
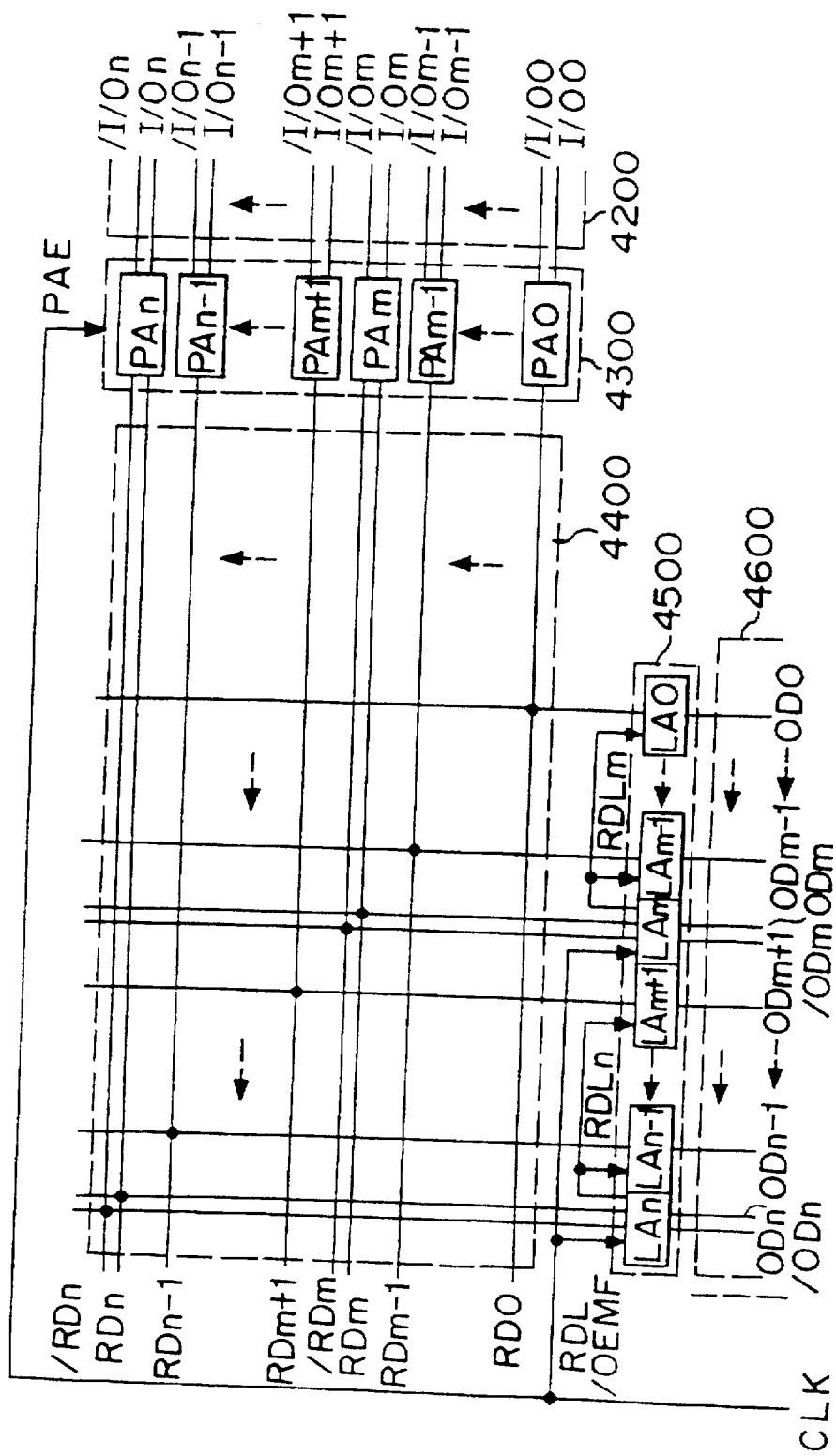
FIG. 13 is a block diagram for showing configurations of a preamplifier area, a data line area of a first system and an intermediate latch circuit area in accordance with Embodiment 4 of the present invention.

FIG. 13 is a block diagram for showing Embodiment 4 of the present invention. In the structure shown in Embodiment 3, one set of the standard pair of complementary data lines is provided in the data line of the first system as much as n+1 in one array block. However, in FIG. 13, two standard pairs of complementary data lines are provided in the n+1 data lines of the first system. A numerical reference 4200 designates an I/O line area; a numerical reference 4300 designates a P.A. area; a numerical reference 4400 designates a data line area of the first system; a numerical reference 4500 designates an intermediate latch circuit area; and a numerical reference 4600 designates a data line area of the second system.

In Embodiment 4, references PAn and PAm designate standard preamplifiers; references RDn./RDn and RDm./RDm designate standard pairs of complementary data lines of the first system; and references LAn and LAm designate standard intermediate latch circuits. The intermediate latch circuits LA0 through LAm−1 are controlled by a standard signal for controlling data holding RDLm output from the standard intermediate latch circuit LAm, and the intermediate latch circuits LAm+1 through LAn−1 are controlled by the standard signal for controlling data holding RDLn output from the standard intermediate latch circuit LAn. Further, the data lines of the second system output from the standard intermediate latch circuits LAn and LAm are composed of pairs of complementary data lines ODn./ODn and ODm./ODm. Details of the circuits and operation thereof are similar to those described in Embodiment 3.

It is possible to further increase the number of the standard pair of complementary data lines. Further, it is possible to provide the standard pair of complementary data lines commonly with respect to a plurality of array blocks.

EMBODIMENT 5

Figure 14:
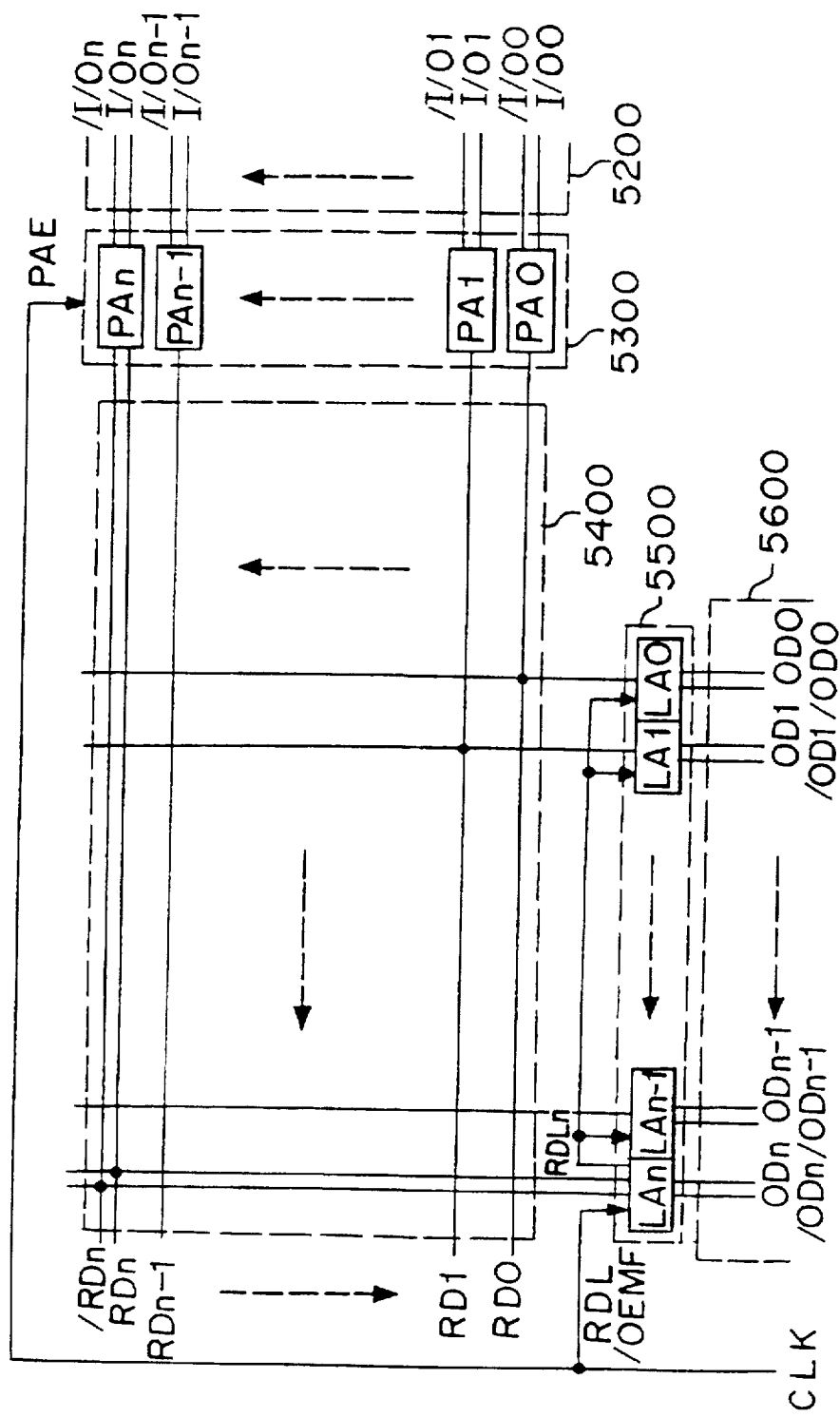
FIG. 14 is a block diagram for showing configurations of a preamplifier area, a data line area of a first system and an intermediate latch circuit area in accordance with Embodiment 5 of the present invention.

FIG. 14 is a block chart for showing Embodiment 5 of the present invention. In the structure described in Embodiment 3, the data line of the second system output from the standard intermediate latch circuit LAn is the pair of complementary data lines. However, in FIG. 14, data lines of the second system output from the intermediate latch circuits LA0 through LAn−1 other than the standard intermediate latch circuit LAn are respectively composed of a pair of complementary data lines. A numerical reference 5200 designates an I/O line area; a numerical reference 5300 designates a P.A area; a numerical reference 5400 designates a data line area of the first system; a numerical reference 5500 designates an intermediate latch circuit area; and a numerical reference 5600 designates a data line area of the second system.

In Embodiment 5, a reference PAn designates a standard amplifier; references RDn./RDn designate a standard pair of complementary data lines of the first system and a reference LAn designates a standard intermediate latch circuit, wherein all of the data lines of the second system output from the intermediate latch circuits LA0 through LAn are respectively composed of a pair of complementary data lines. In other word, the output from the composite gate 1550 is output to drive to the data line /ODn by a newly provided inverter for outputting to drive in response to an event that the output from the composite gate 1540 of the standard intermediate latch circuit LAn shown in FIG. 6 is output to drive to the data line ODn by the inverter 1544. Further, the output ODi of the intermediate latch circuit LAi shown in FIG. 8 is inverted by a newly provided inverter and output to drive to the data line /ODi. Details of circuits and operation thereof are similar those described in Embodiment 1.

EMBODIMENT 6

Figure 15:
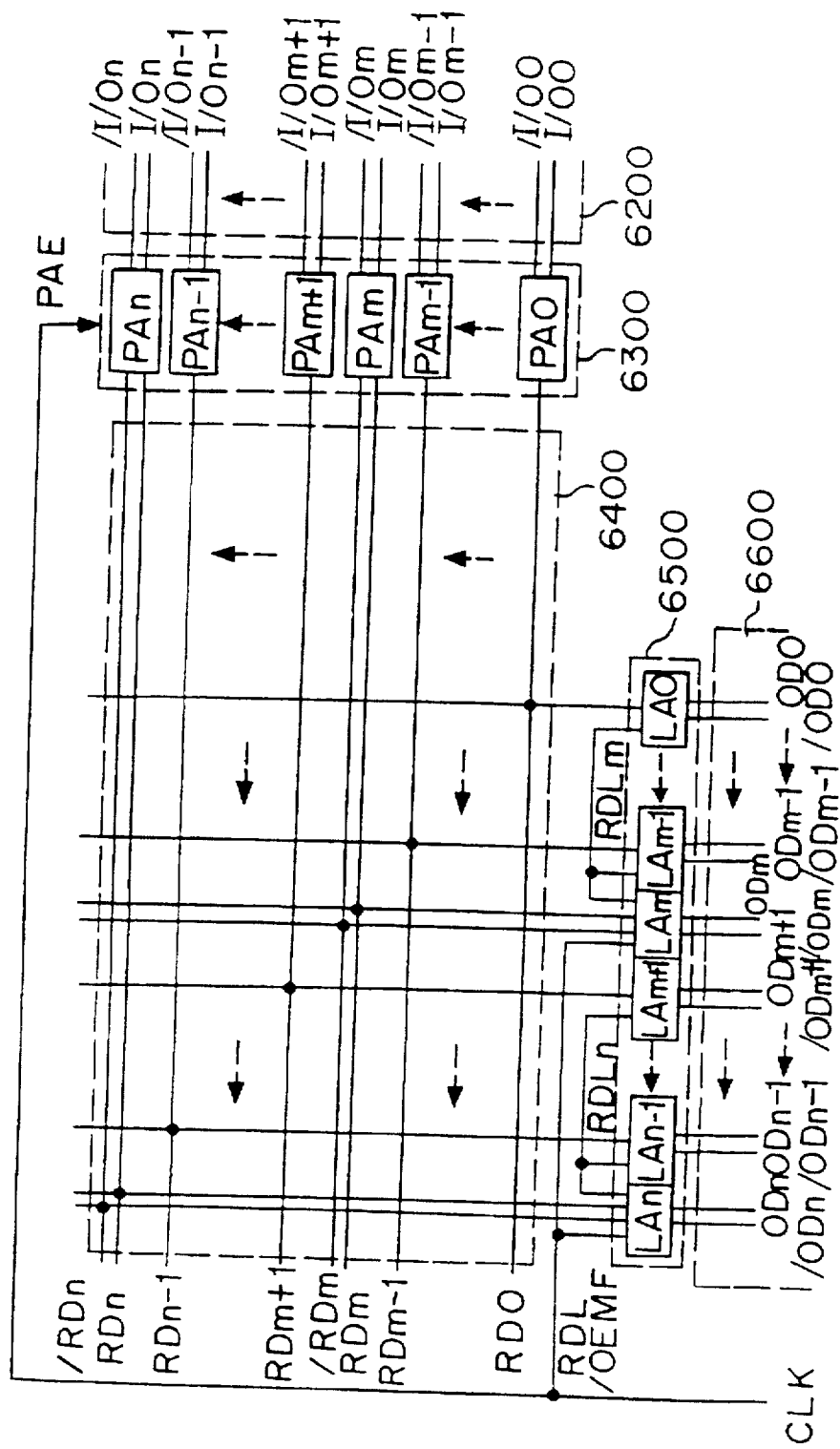
FIG. 15 is a block diagram for showing configurations of a preamplifier area, a data line area of a first system and an intermediate latch circuit area in accordance with Embodiment 6 of the present invention.

FIG. 15 is a block diagram for showing Embodiment 6 of the present invention. In the structure described in Embodiment 5, a standard pair of complementary data lines is provided in the data lines of the first system as much as n+1 in one array block. However, in FIG. 15, two standard pairs of complementary data lines are provided in the n+1 data lines of the first system. A numerical reference 6200 designates an I/O line area; a numerical reference 6300 designates a P.A area; a numerical reference 6400 designates a data line area of the first system; a numerical reference 6500 designates an intermediate latch circuit area; and a numerical reference 6600 designates a data line area of the second system.

19

In Embodiment 6, references PAn and PAm designate a standard amplifiers; references RDn./RDn and RDm./RDm designate standard pairs of complementary data lines of the first system; and references LAn and LAm designate standard intermediate latch circuits. Intermediate latch circuits LA0 through LAm−1 are controlled by a standard signal for controlling data holding RDLm output from the standard intermediate latch circuit LAm, and intermediate latch circuits LAm+1 through LAn−1 are controlled by a standard signal for controlling data holding RDLn output from the standard intermediate latch circuit LAn. The data lines of the second system output from the intermediate latch circuits other than the standard intermediate latch circuits LAn and LAm are respectively composed of a pair of complementary data lines. Details of circuits and operation thereof are similar to those described in Embodiment 5.

Further, it is possible to increase the number of standard pair of complementary data lines. Further, it is also possible to provide the standard pair of complementary data lines commonly with respect to a plurality of array blocks.

EMBODIMENT 7

Figure 16:
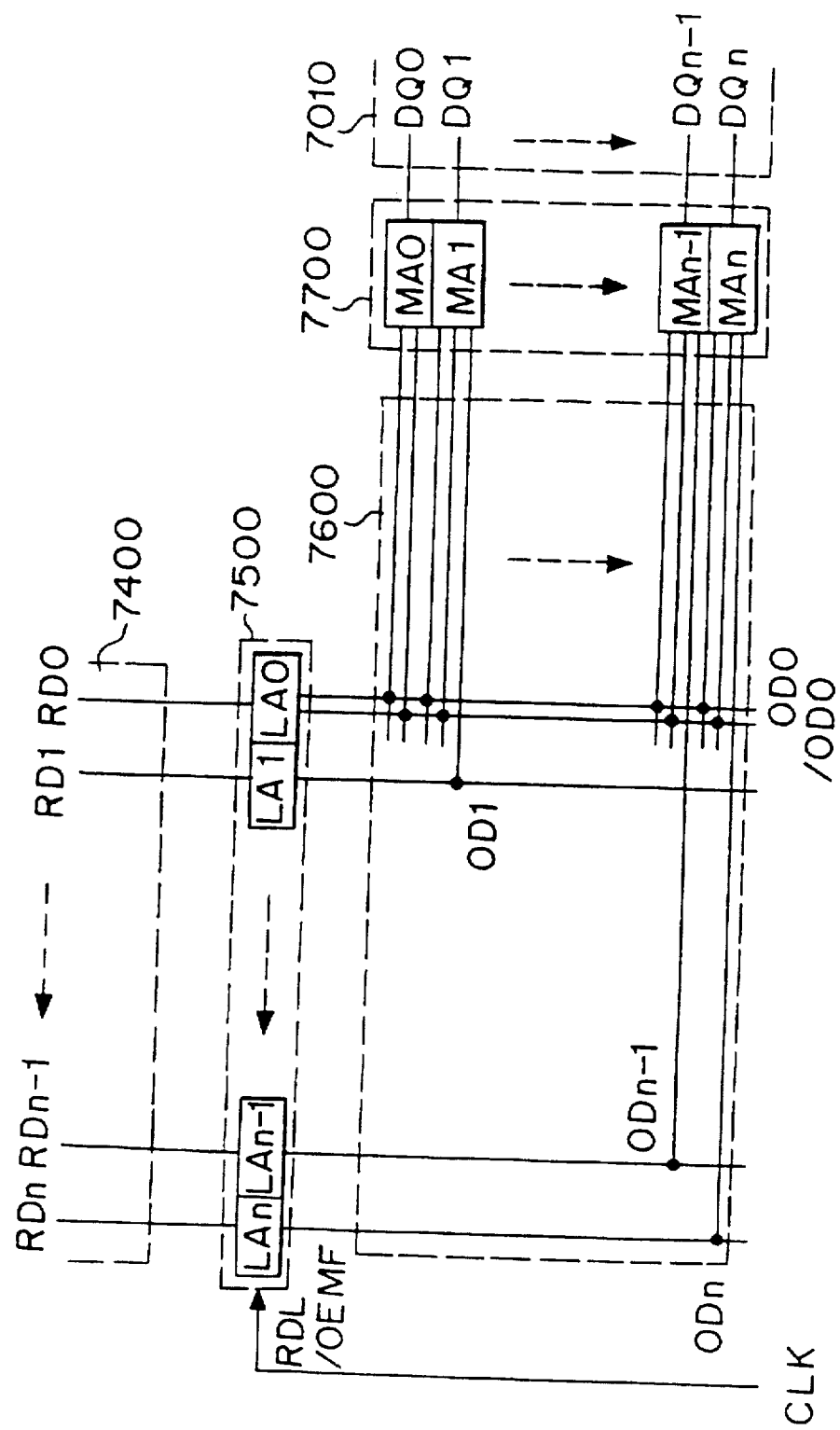
FIG. 16 is a block diagram for showing configurations of one of array blocks, a data line area of a first system corresponding thereto, an intermediate latch circuit area, a data line area of a second system and a main amplifier area.

FIG. 16 is a block diagram for showing Embodiment 7 of the present invention. In FIG. 16, the present invention is applied particularly to the data line of the second system in the DRAM shown in FIG. 1. FIG. 16 shows a case that the data lines of the first system, the intermediate latch circuits, the data lines of the second system and the main amplifiers, which are corresponding to one array block 1001, are respectively as much as n+1. In FIG. 16, a standard pair of complementary data lines exists in a data line area of the second system 7600; all other data lines in the same system are single data lines; and a data line area of the first system 7400 is composed of only single data lines.

In FIG. 16, the single data lines of the first system RD0 through RDn are respectively connected to the intermediate latch circuits LA0 through LAn; the output from the intermediate latch circuit LA0 is connected to the pair of complementary data lines of the second system OD0./OD0; and the outputs from the other intermediate latch circuits LA1 through LAn are connected respectively to the independent data lines of the second system OD1 through ODn. The main amplifier MA0 is connected to the pair of complementary data lines of the second system OD0./OD0 to thereby output data from an input/output terminal DQ0 to the outside. The other main amplifiers MA1 through MAn are connected respectively to the pair of complementary data lines of the second system OD0./ODn and further connected to the corresponding single data line among OD1 through ODn to thereby output data from the corresponding input/output terminal among DQ1 through DQn to the outside.

Hereinbelow, the pair of complementary data lines of the second system OD0./OD0 is referred to as a standard pair of complementary data lines; and the intermediate latch circuit LA0 and the main amplifier MA0 each corresponding thereto are respectively referred to as a standard intermediate latch circuit and a standard main amplifier.

Figure 17:
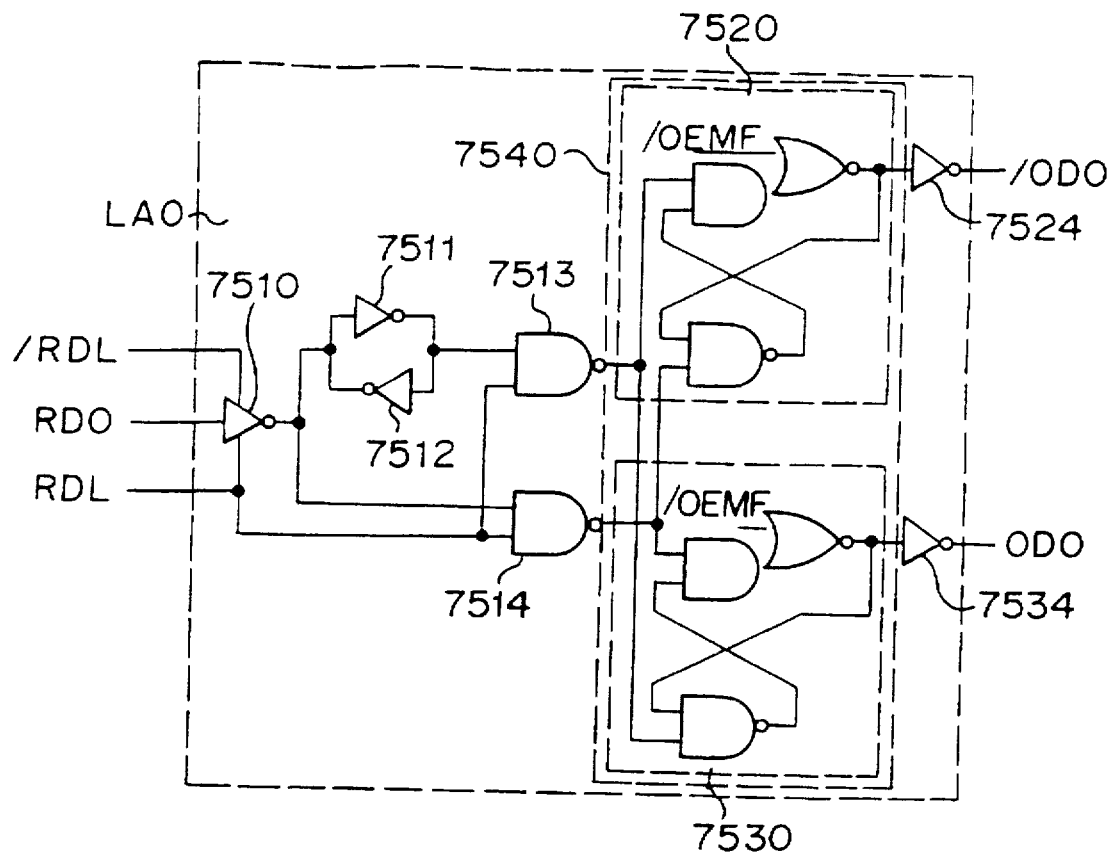
FIG. 17 is a circuit diagram of a standard intermediate latch circuit preamplifier LA0 shown in FIG. 16.

FIG. 17 is a circuit diagram of the standard intermediate latch circuit LA0 shown in FIG. 16. In the Figure, a numerical reference 7510 designates a clocked inverter for taking valid data transmitted through the data line of the first system RD0 in the standard intermediate latch circuit LA0 by a signal for controlling data holding RD1. Inverters 7511 and 7512 compose a latch circuit for holding these valid data taken therein. An NAND gate 7513 inputs the data held in the latch circuit and the signal for controlling data holding RDL. An NAND gate 7514 inputs data inverted by the clocked inverter and the signal for controlling data holding RDL.

20

A numerical reference 7540 designates a circuit which receives the outputs from the NAND gates 7513 and 7514 and a signal /OEMF activated in timing earlier than the signal for controlling output, and holds automatically the valid data transmitted through the pair of data lines of the first system RDn./RDn when these data become complementary to each other as the outputs from the NAND gates 7513, 7514. A numerical reference 7520 designates a composite gate for holding the valid data transmitted through the data line RDn, which is one of the pair of data lines of the first system, and output from the NAND gate 7513. A numerical reference 7530 designates a composite gate for holding the valid data transmitted through the data line /RDn, which is the other one of the pair of data lines of the first system, and output from the NAND gate 7514.

Numerical references 7524 and 7534 designate inverters which invert the outputs from the composite gates 7520 and 7530 and output to drive to the pair of data lines of the second system OD0./OD0. Further, when /OEMF input to the composite gates 7520 and 7530 is deactivated (i.e. the H level), the standard pair of complementary data lines of the second system OD0./OD0 are pre-charged.

Figure 18:
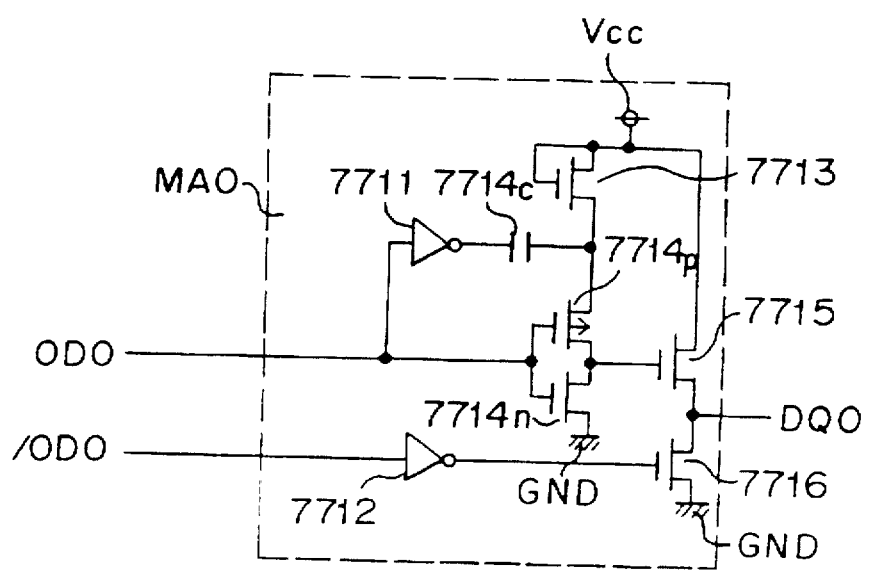
FIG. 18 is a circuit diagram of a standard main amplifier MA0 shown in FIG. 16.

FIG. 18 is a block diagram of the standard main amplifier MA0 shown in FIG. 16. In the Figure, a reference Vcc designates a source electric potential; a reference GND designates a ground electric potential; a reference 7713 designates an N-channel type transistor for charging, both of which gate and source are connected to the source electric potential Vcc; a numerical reference 7711 designates an inverter which inverts data transmitted through one of the standard pair of complementary data lines of the second system OD0; a numerical reference 7714c designates a capacitor for boosting connected between the output node of the inverter 7711 and the source of the N-channel type transistor for charging 7713; and numerical references 7714p and 7714n designate respectively a P-channel type transistor and an N-channel type transistor which are connected between the source of the N-channel type transistor for charging 7713 and the ground electric potential GND in serial and both of which gates are connected to the data line OD0. Numerical references 7715 and 7716 designate N-channel type transistors connected between the source electric potential Vcc and the ground electric potential GND in serial, wherein the N-channel type transistor 7715 is conducted upon receipt of a boost electric potential in its gate through the P-channel type transistor 7714p to thereby output the H level from the input/output terminal DQ0; and the N-channel type transistor 7716 receives a signal obtained by inverting data transmitted through the other one of the standard pair of complementary data lines /OD0 by the inverter 7712 in its gate and outputs the L level from the input/output terminal DQ0 when it is conducted. These N-channel type transistors 7715 and 7716 also have a duty to drive wiring to the input/output terminal DQ0 and outer wiring connected to the input/output terminal DQ0.

Figure 19:
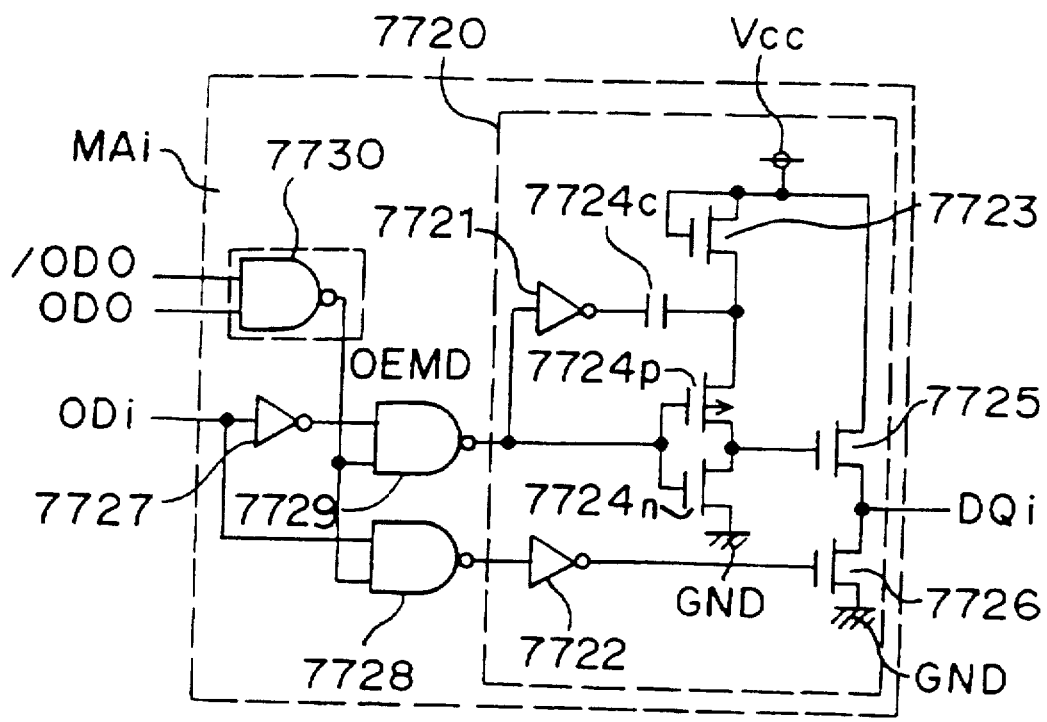
FIG. 19 is a circuit diagram of main amplifiers MA1 through MAn shown in FIG. 16.

FIG. 19 is a circuit diagram which is common to the main amplifiers MA1 through MAn other than the standard main amplifier MA0 shown in FIG. 16, wherein this circuit diagram is referred to as MAi. In the Figure, a numerical reference 7730 designates a circuit for detecting valid data which detects an event that data transmitted through the standard pair of complementary data lines of the second system OD0./OD0 become complementary to each other, outputs a standard signal for controlling data output OEMD for controlling timing for outputting data from the main amplifier MAi, and is composed of an NAND gate inputting from the standard pair of complementary data lines of the second system OD0./OD0. The output OEMD from the circuit for detecting valid data 7730 corresponds to a result of detection, wherein when both of the pair of data lines of the second system OD0./OD0 are pre-charged with the H level, the output OEMD is at the L level and when the valid data arrive it changes to the H level. A numerical reference 7728 designates an NAND gate which inputs the standard signal for controlling data output OEMD and data transmitted through the single data line of the second system ODi, wherein it inverts the data transmitted through the data line ODi when the standard signal for controlling data output OEMD is activated and transmits the inverted data to an output buffer 7720. A numerical reference 7729 designates an NAND gate which inputs the standard signal for controlling data output OEMD and data obtained by inverting the data transmitted through the single data line of the second system ODi by an inverter 7727, wherein this gate transmits the inverted data originally in the data line ODi to the output buffer 7720 when the standard signal for controlling data output OEMD is activated.

The output buffer 7720 has the same structure as that of the standard main amplifier shown in FIG. 18 and the outputs from the NAND gates 7729 and 7728 correspond respectively to the input data OD0./OD0 shown in FIG. 18.

Figure 20:
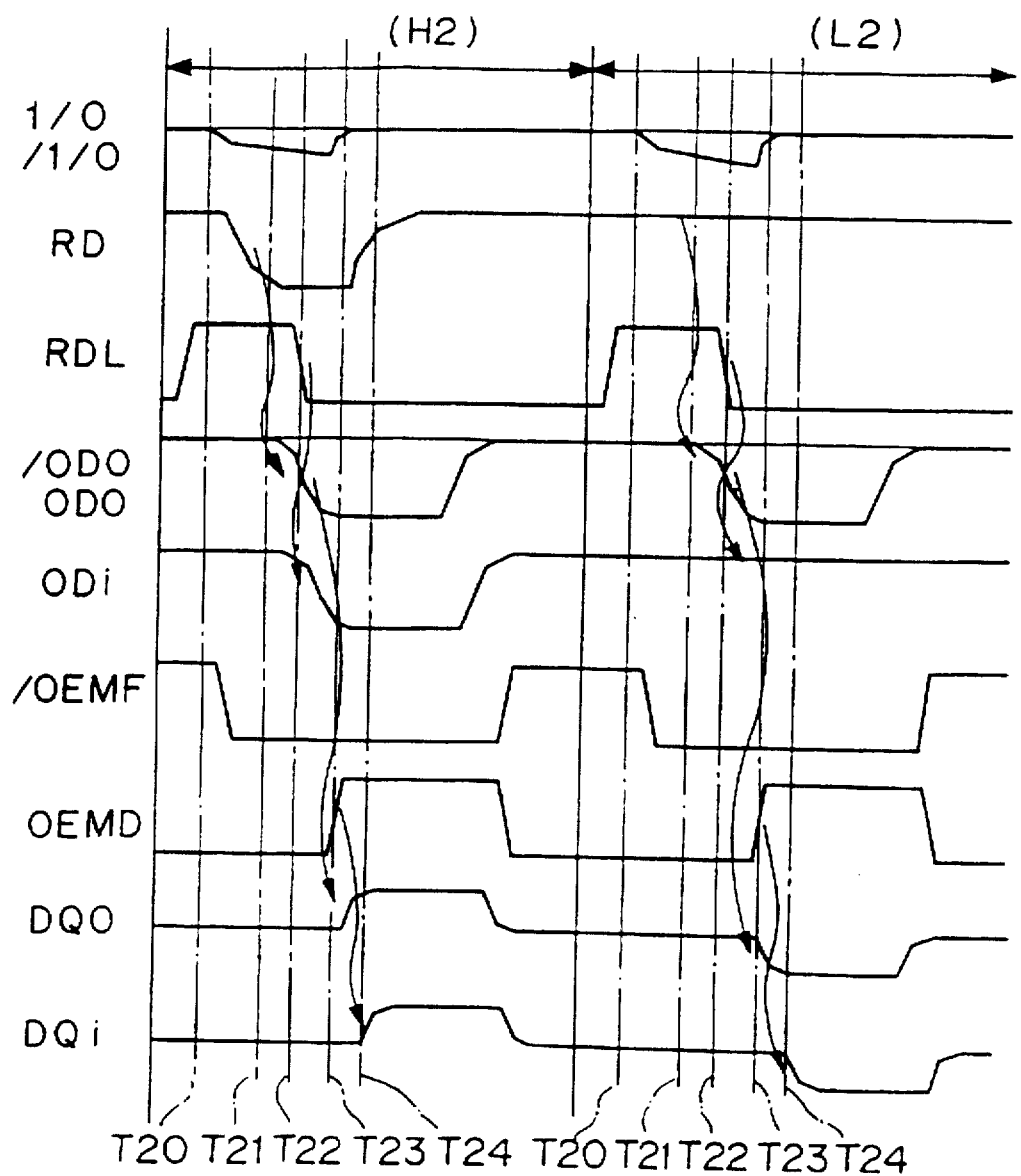
FIG. 20 is a timing chart for showing an operation of DRAM in accordance with Embodiment 7 of the present invention.

In the next, an operation will be described. FIG. 20 is a timing chart for showing the operation of Embodiment 7.

References I/O, /I/O designate data in a memory cell transmitted to a pair of I/O lines through a pair of bit lines and a sense amplifier. In this case, identical data are read out by the pairs of I/O lines suffixed by 0 through n. A reference RD designates data transmitted through a single data line of the first system RD; a reference RDL designates a signal for controlling data holding of the intermediate latch circuits LA0 through LAn; references OD0./OD0 designate data transmitted through the standard pair of complementary data lines of the second system OD0./OD0 output from the standard intermediate latch circuit LA0; a reference ODi designates data transmitted through a single data line of the second system ODi output from one of the other intermediate latch circuits LAi; a reference /OEMF designates a signal for holding the output from the standard intermediate latch circuit LA0 and controlling the pre-charge; a reference OEMD designates the standard signal for controlling data output which is the result of detection by the circuit for detecting valid data 7730 included in one of the main amplifiers MAi other than the standard main amplifier MA0; and a reference DQ0 designates data output from the input/output terminal DQ0, wherein, in this case, identical data are output to the terminals DQ0 through DQn. A reference DQi designates data output from an input/output terminal DQi. In FIG. 20, a reference (H2) shows a case that the data output from the input/output terminal DQ is at the H level and a reference (L2) shows a case that the output data is at the L level.

Data in a memory cell at an address designates at a time T20 appear in a pair of I/O lines after passing through a pair of bit lines and a sense amplifier. Hereinbelow, such data are referred to as valid data.

At a time T21, a preamplifier is activated to output the L level to the pair of data lines of the first system RDi. In this, a signal waveform of PAE is not shown.

The clocked inverter 7510 of the standard intermediate latch circuit LA0 does not take data transmitted through the data line of the first system RD0 in the intermediate latch circuit LA0 when the signal for controlling data holding RDL is at the L level. The outputs from the NAND gates 7513 and 7514 are both at the H level in response to an event that the signal for controlling data holding RDL is at the L level. In the next, when the signal for controlling data holding RDL becomes the H level, the data transmitted through the data line of the first system RD0 are taken in the inside of the intermediate latch circuit LA0. At this time, since the other intermediate latch circuits have the same structure as that of the intermediate latch circuit shown in FIG. 8 and receive RDL./RDL instead of RDLn./RDLn, the clocked inverter on the input side 1561 is in a state of taking data transmitted through the data line of the first system RDi in the latch circuit composed of the inverters 1563 and 1564.

When the valid data are transmitted through the data line of the first system RDi, the data in the data line RDi are changed from the H level to the L level. In the standard intermediate latch circuit LA0 shown in FIG. 17, as long as the signal for controlling data holding RDL is at the H level, the output from the NAND gate 7513 becomes at the H level and the output from the NAND gate 7514 becomes at the L level, whereby the above data is transmitted to the latch circuit 7540. Further, since the pre-charge signal /OEMF is always at the L level, the valid data are respectively held automatically in the composite gates 7520 and 7530; and simultaneously, the L level is output to drive to one of the standard pair of complementary data lines of the second system OD0 and the H level is output to drive to the other /OD0.

At a time T22, the signal for controlling data holding RDL becomes at the L level at timing predetermined in designing. In response thereto, the clocked inverter 1561 on the input side of one of the other intermediate latch circuit LAi shown in FIG. 8 stops to take the data transmitted through the data line of the first system RDi therein; and the clocked inverter on the output side 1562 inverts the data held in the latch circuit composed of the inverters and outputs to drive to a single data line ODi of the second system instead.

At a time T23, the valid data transmitted through the standard pair of complementary data lines of the second system OD0./OD0 are transmitted to the corresponding standard main amplifier MA0. In response thereto, the inverter 7712 shown in FIG. 18 outputs the L level and thereby the N-channel type transistor which receives this output in its gate is not conducted. Meanwhile, since the valid data in one of the standard pairs of complementary data lines OD0 is at the L level, the P-channel type transistor 7714p is conducted. The source of P-channel type transistor 7714p is pre-charged with an electric potential of Vcc-Vth by the N-channel type transistor for charging 7713, where Vth is a threshold voltage of the N-channel type. transistor 7713. Further, when the data line OD0 is at the L level, the output from the inverter 7711 becomes at the H level and is received by one of the electrodes of the capacitor for boosting 7714c. Therefore, the electric potential of the source side of the P-channel type transistor 7714p connected to the other electrode of the capacitor for boosting 7714c is boosted to an electric potential of Vcc-Vth+a . Accordingly, the gate of the N-channel type transistor 7715 receives the electric potential of Vcc-Vth+a and data of the H level equal to the source electric potential are output to drive from the input/output terminal DQ0. On the other hand, the circuit for detecting valid data 7730 in the other main amplifier LAi detects an event that the data in the standard pair of complementary data lines become complementary, in other words, an arrival of the valid data at the circuit for detecting valid data 7730 in the main amplifiers MA1 through MAn is detected, whereby the standard signal for controlling data output OEMD becomes the H level.

At a time T24, the main amplifier MAi enables a data output from an input/output terminal DQi in response to the event that the standard signal for controlling data output is at the H level. When the valid data transmitted through the single data lines of the second system arrive at each main amplifier, since the standard signal for controlling data output OEMD is at the H level and data in the single data line of the second system ODi is at the L level, the output from the NAND gate 7729 becomes at the L level and the output from the NAND gate 7728 becomes at the H level. In response thereto, the inverter 7722 outputs the L level and thereby the N-channel type transistor 7726 is not conducted. Meanwhile since the output from the N-channel type transistor 7726 is at the L level, the P-channel type transistor 7724p is conducted. The source potential of the P-channel type transistor 7724p is pre-charged with an electric potential of Vcc-Vth, by the N-channel type transistor 7723 for charging, where Vth is a threshold voltage of the N-channel type transistor 7723. Further, when the data line ODi becomes the L level, the output from the inverter 7721 becomes at the H level to serve one of the electrodes of the capacitor for boosting 7724c with the output. Therefore, the electric potential of the source of the P-channel type transistor 7724p connected to the other electrode of the capacitor for boosting 7724c is boosted to be an electric potential of Vcc-Vth+α. Accordingly, the gate of the N-channel type transistor 7725 receives the electric potential of Vcc-Vth+α, and data of the H level equal to the source electric potential are output to drive from the input/output terminal DQi. The periods represented by (L2) show a case that data output from the input/output terminal DQ is at the L level, namely, valid data appear in the pair of I/O lines arrive from the sense memory cell through the pair of bit lines and the sense amplifier are inverted, wherein the operation at the times represented by T20 through T24 are similar to those described in the above.

As described in the above, the circuits for detecting valid data 7730 detects arrival of valid data transmitted through the pair of complementary data lines of the second system OD0./OD0, which pair is subjected to ternary control, respectively at main amplifier MA0 through MAn, and timing for outputting valid data transmitted through the other single data lines of the second system OD1 through ODn, which are subjected to binary control, from a corresponding main amplifier through the input/output terminals DQ1 through DQn is controlled based on a signal OEMD corresponding to the detected signal.

EMBODIMENT 8

Figure 21:
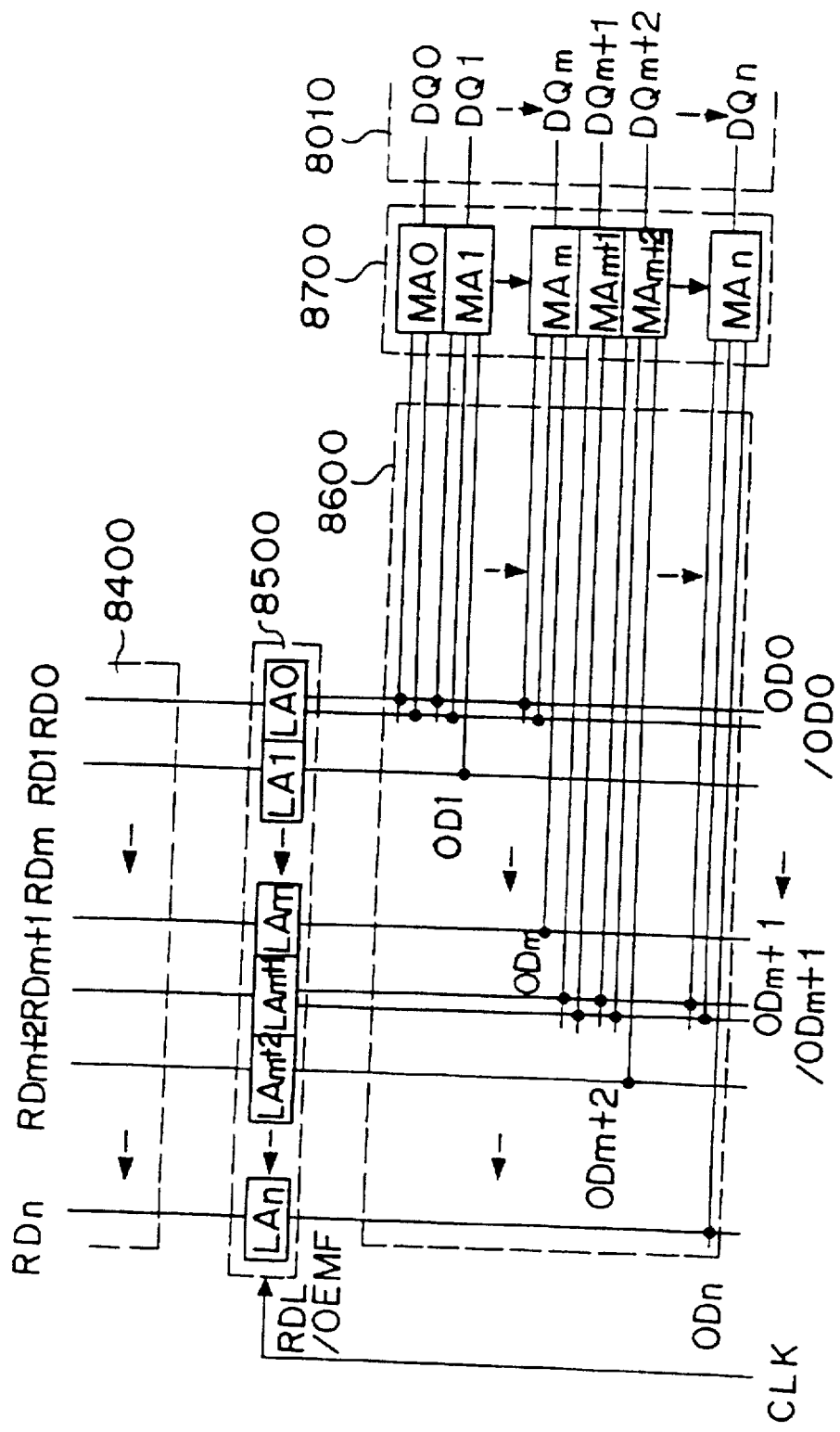
FIG. 21 is a block diagram for showing configurations of a data line area of a first system, an intermediate latch circuit area, a data line area of a second system and a main amplifier area in accordance with Embodiment 8 of the present invention.

FIG. 21 is a block diagram for showing Embodiment 8 of the present invention. In the structure described in Embodiment 7, the one standard pair of complementary data lines is provided in the data lines of the second system as much as n+1 corresponding to one array block. However, in FIG. 21, two standard pairs of complementary data lines are provided in the data lines of the second system as much as n+1. A numerical reference 8400 designates a data line area of the first system; a numerical reference 8500 designates an intermediate latch circuit area; a numerical reference 8600 designates a data line area of the second system; a numerical reference 8700 designates an M.A area; and a numerical reference 8010 designates input/output terminals.

In Embodiment 8, references LA0 and LAm+1 designate standard intermediate latch circuits; references OD0./OD0 and references ODm+1./ODm+1 designate standard pairs of complementary data lines of the second system; and references MA0, MAm+1 designate standard main amplifiers. Main amplifiers MA1 through MAm output data from the corresponding input/output terminal in response to an event that data output from the standard intermediate latch circuit LA0 and transmitted through the standard pair of complementary data lines change to data complementary to each other, in other words, in response to timing of arrival of valid data at the standard main amplifier. The main amplifiers MAm+2 through MAn output data from the corresponding input/output terminal in response to a change of data in the standard pair of complementary data lines output from the standard intermediate latch circuit LAm+1 to complementary data. Details of circuits and operation thereof are the same as those described in Embodiment 7.

Further, it is possible to further increase the number of the standard pairs of complementary data lines. Further, it is also possible to provide the standard pairs of complementary data lines by the common number with respect to a plurality of array blocks.

EMBODIMENT 9

Figure 22:
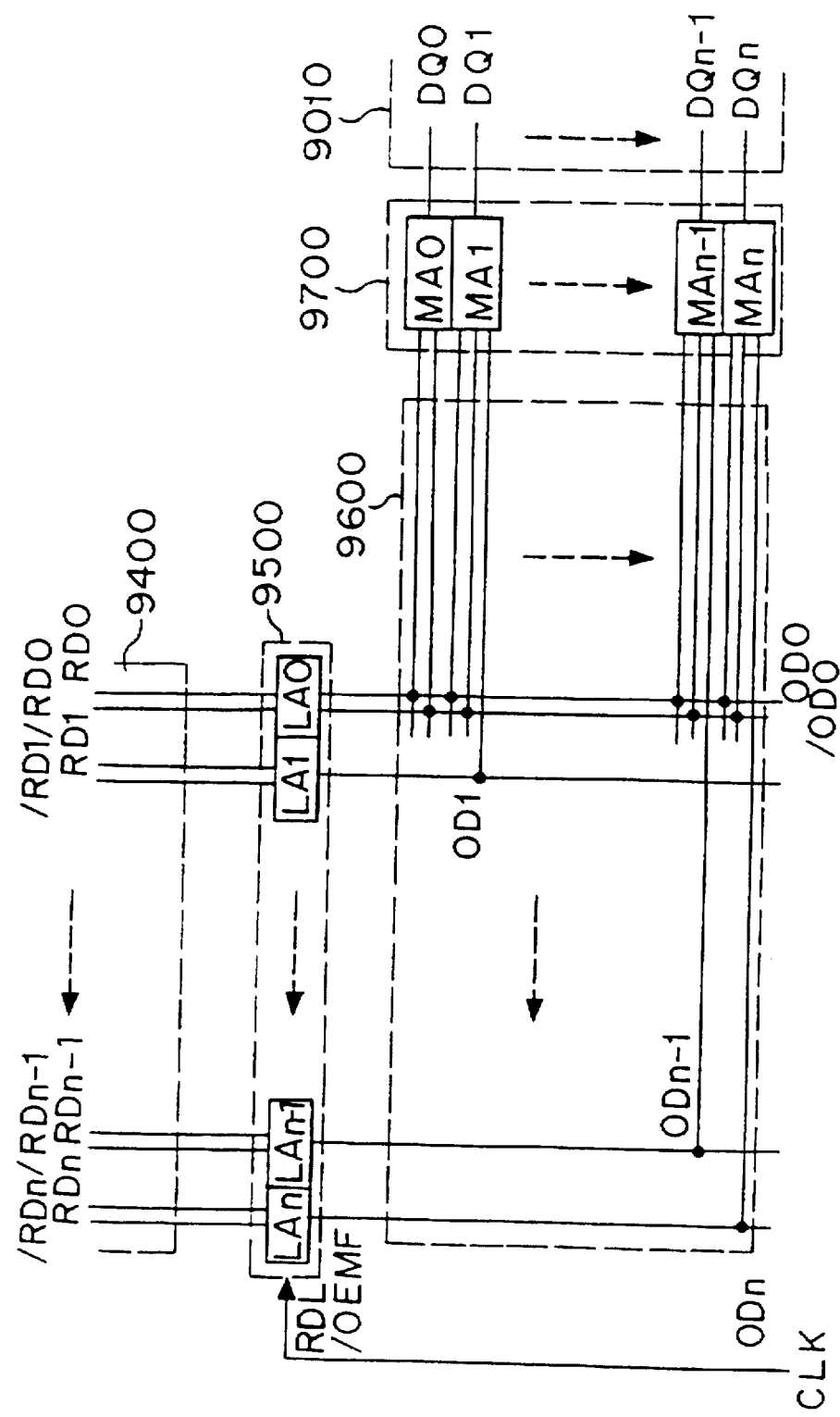
FIG. 22 is a block diagram for showing configurations of a data line area of a first system, an intermediate latch circuit area, a data line area of a second system and a main amplifier area in accordance with Embodiment 9 of the present invention.

FIG. 22 is a block diagram for showing Embodiment 9 of the present invention. In the structure described in Embodiment 7, the data lines of the first system input in the intermediate latch circuits LA0 through LAn are single data lines. However, in FIG. 22, all of the data lines of the first system input in the intermediate latch circuits LA0 through LAn are respectively composed of a pair of complementary data lines. A numerical reference 9400 designates a data line area of the first system; a numerical reference 9500 designates an intermediate latch circuit area; a numerical reference 9600 designates a data line area of the second system; a numerical reference 9700 designates an M.A area; and a numerical reference 9010 designates input/output terminals.

In Embodiment 9, a reference LA0 designates a standard intermediate latch circuit; references OD0./OD0 designate a standard pair of complementary data lines of the second system; and a reference MA0 designates a standard main amplifier. Since all of the intermediate latch circuits LA0 through LAn input from pairs of complementary data lines, it is constructed by the circuit excluding the circuit for detecting valid data 1510 of the intermediate latch circuit shown in FIG. 6. Operation of a main amplifier for outputting data from its input/output terminal in response to a change of data, in the standard pair of complementary data lines output from the standard intermediate latch circuit, to complementary data is the same as that described in Embodiment 7.

EMBODIMENT 10

Figure 23:
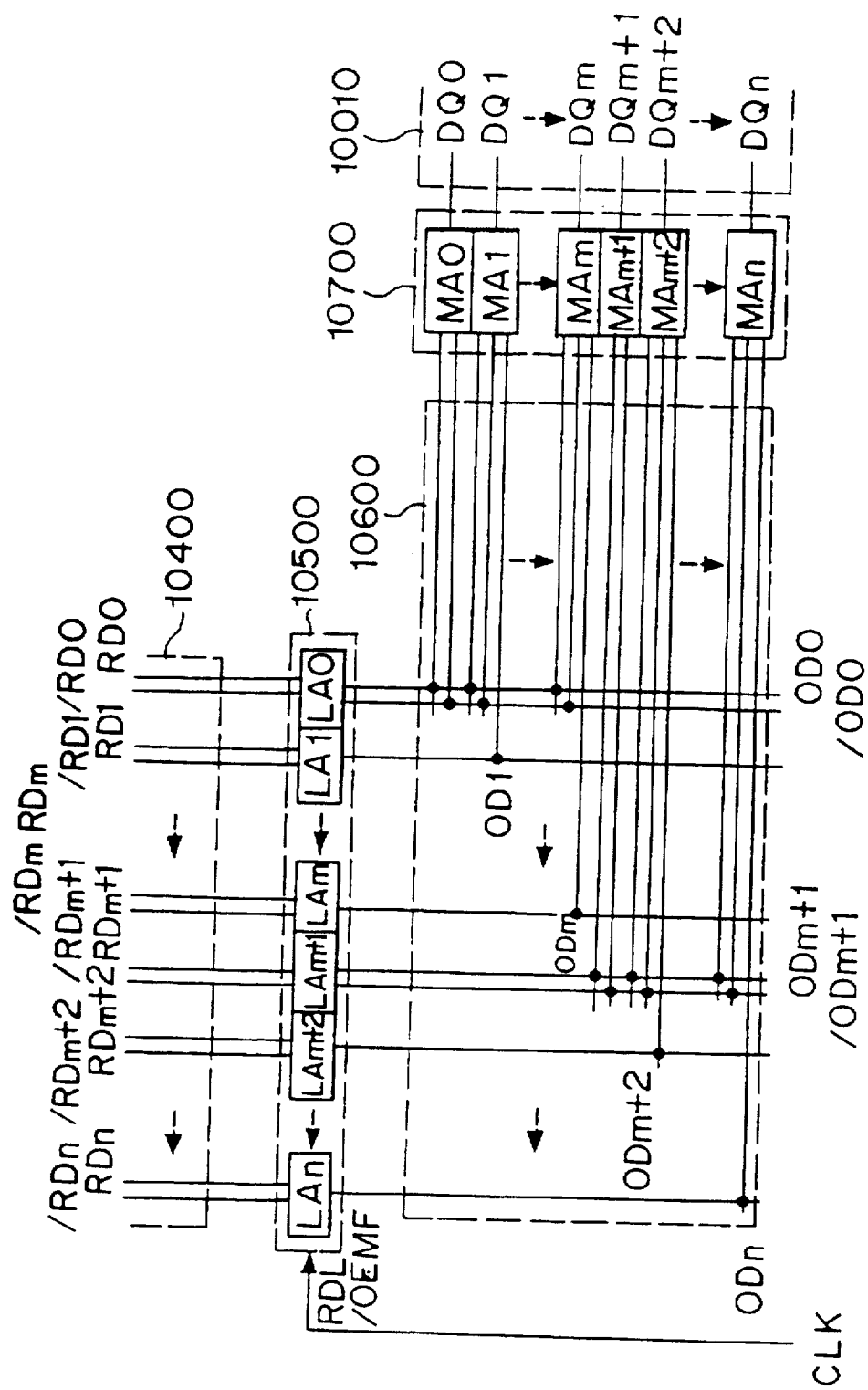
FIG. 23 is a block diagram for showing configurations of a data line area of a first system, an intermediate latch circuit area, a data line area of a second system and a main amplifier area in accordance with Embodiment 10 of the present invention.

FIG. 23 is a block diagram for showing Embodiment 10 of the present invention. In the structure described in Embodiment 9, the one standard pair of complementary data lines is provided in the data lines of the second system as much as n+1 corresponding to one array block. However, in FIG. 21, two standard pairs of complementary data lines are provided in the data lines of the second system as much as n+1. A numerical reference 10400 designates a data line area of the first system; a numerical reference 10500 designates an intermediate latch circuit area; a numerical reference 10600 designates a data line area of the second system; a numerical reference 10700 designates an M.A area; and a numerical reference 10010 designates input/output terminals.

In Embodiment 10, references LA0, LAm+1 designate standard intermediate latch circuits; references OD0./OD0 and references ODm+1./ODm+1 designate standard pairs of complementary data line of the second system and references MA0, MAm+1 designate standard main amplifiers. Main amplifiers MA1 through MAm are controlled to output from the corresponding input/output terminal in response to a change of data output from the standard intermediate latch circuit LA0 and transmitted through the standard pair of complementary data lines to mutually complementary data. Main amplifiers MAm+2 through MAn are controlled to output from the corresponding input/output terminal in response to a change of data in the standard pair of complementary data lines output from the standard intermediate latch circuit LAm+1 to complementary data. Operation is the same as those described in Embodiment 9.

It is possible to further increase the number of the standard pairs of complementary data lines. Further, it is also possible to provide the standard pairs of complementary data lines commonly with respect to a plurality of array blocks.

EMBODIMENT 11

Figure 24:
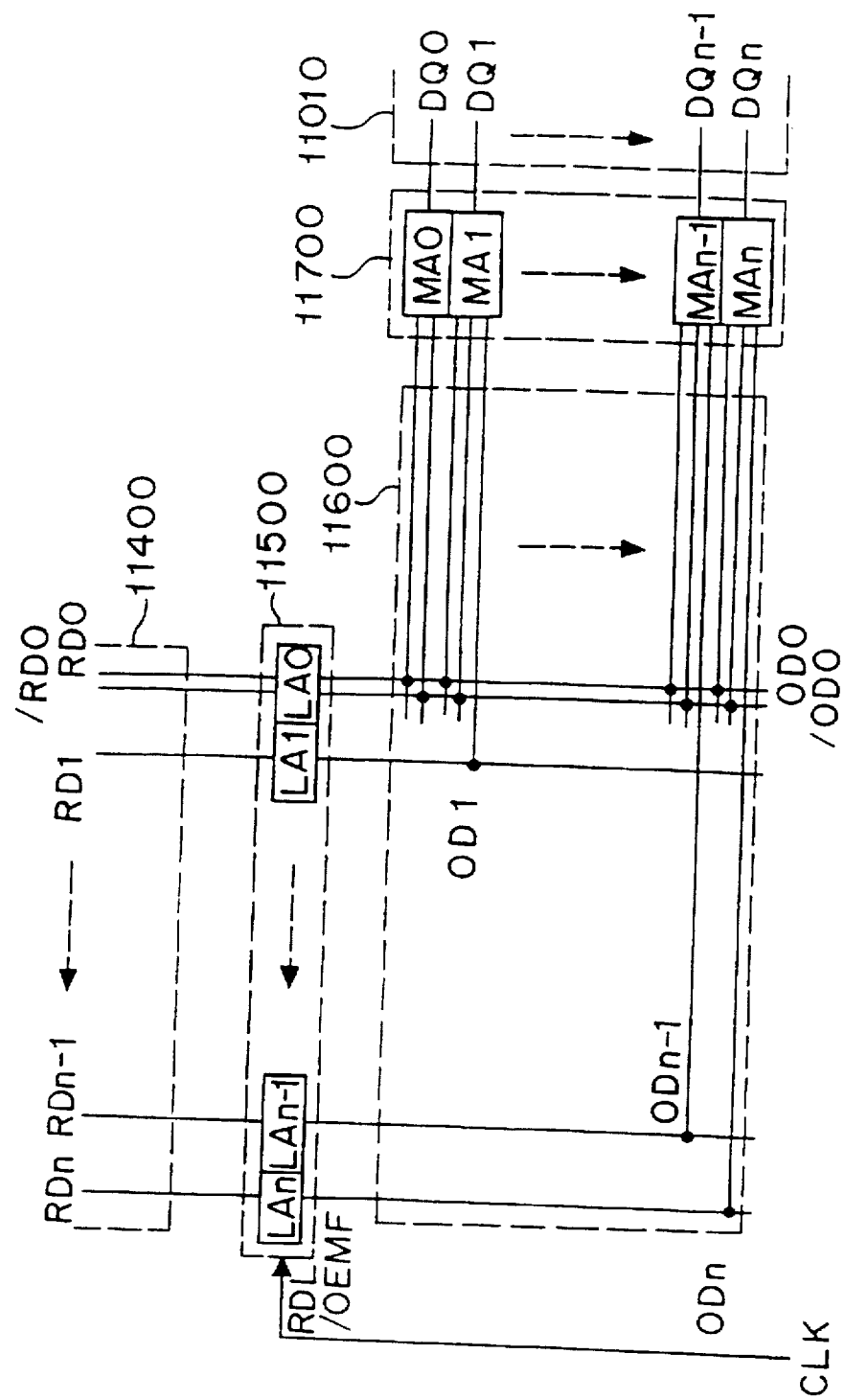
FIG. 24 is a block diagram for showing configurations of a data line area of a first system, an intermediate latch circuit area, a data line area of a second system and a main amplifier area in accordance with Embodiment 11 of the present invention.

FIG. 24 is a block diagram for showing Embodiment 11 of the present invention. In the structure described in Embodiment 7, the data lines of the first system input in the intermediate latch circuits LA0 through LAn are single data lines. However, in FIG. 22, only data lines of the first system input in a standard intermediate latch circuit LA0 is composed of a pair of complementary data lines. A numerical reference 11400 designates a data line area of the first system; a numerical reference 11500 designates an intermediate latch circuit area; a numerical reference 11600 designates a data line area of the second system; a numerical reference 11700 designates an M.A area; a numerical reference 11010 designates input/output terminals.

In Embodiment 11, a reference LA0 designate a standard intermediate latch circuit; references OD0./OD0 designate a standard pair of complementary data lines of the second system and a reference MA0 designates a standard main amplifier. Since only the standard intermediate latch circuit LA0 inputs from the pair of complementary data lines, the circuit is constructed by removing the circuit for detecting valid data 1510 of the intermediate latch circuit shown in FIG. 6. The other intermediate latch circuits LA1 through LAn are constructed as shown in FIG. 8. Details of other circuits and operation are the same as those described in Embodiment 7.

EMBODIMENT 12

Figure 25:
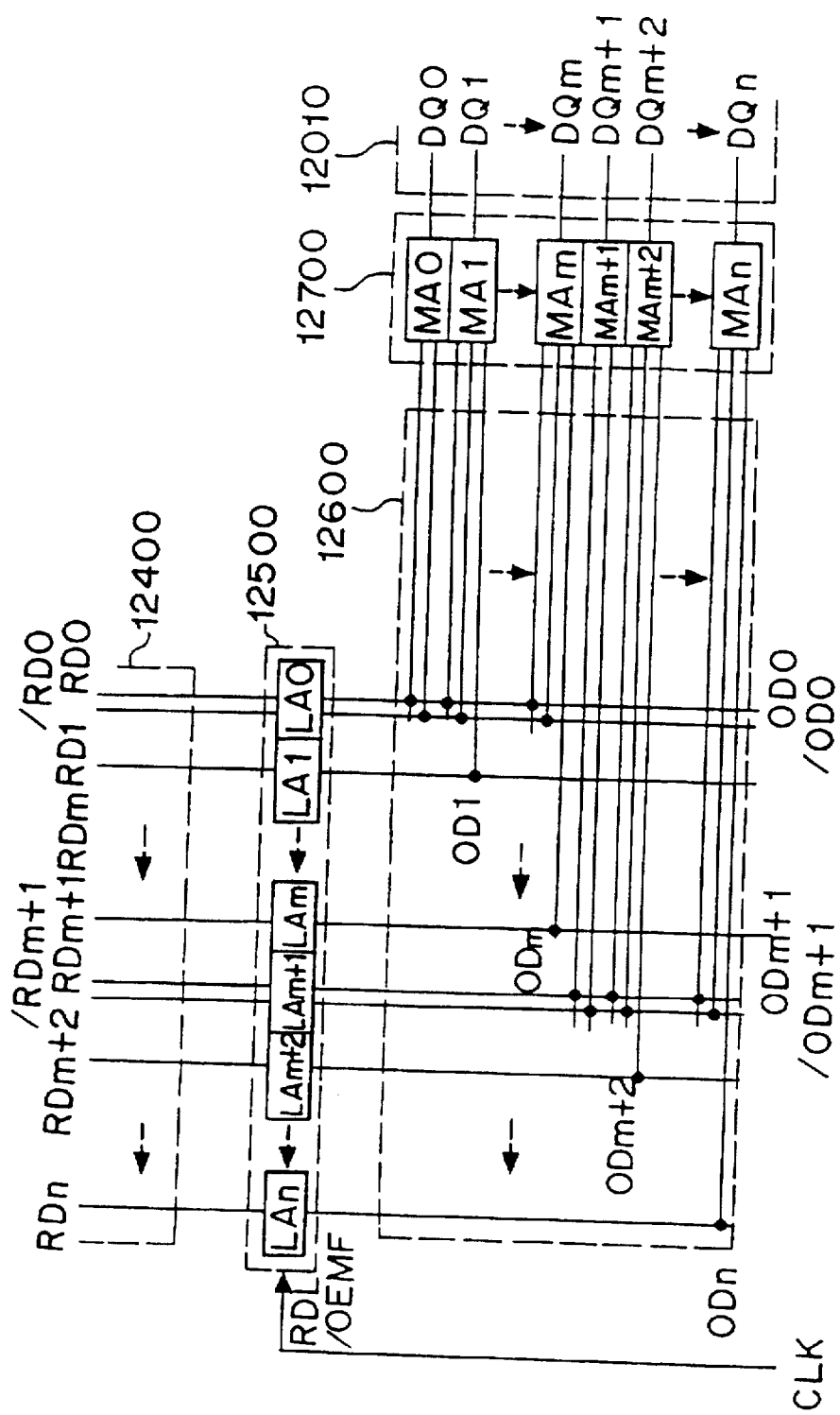
FIG. 25 is a block diagram for showing configurations of a data line area of a first system, an intermediate latch circuit area, a data line area of a second system and a main amplifier area in accordance with Embodiment 12 of the present invention.

FIG. 25 is a block diagram for showing Embodiment 12 of the present invention. In the structure shown in Embodiment 11, the one standard pair of complementary data lines is provided in the data lines of the second system as much as n+1 corresponding to one array block. However, in FIG. 25, two standard pairs of complementary data lines are provided in data lines of the second system as much as n+1. A numerical reference 12400 designates a data line area of the first system; a numerical reference 12500 designates an intermediate latch circuit area; a numerical reference 12600 designates a data line area of the second system; a numerical reference 12700 designates an M.A area; and a numerical reference 12010 designates input/output terminals.

In Embodiment 12, references LA0, LAm+1 designate the standard intermediate latch circuits; references OD0./OD0 and ODm+1./ODm+1 designate standard pairs of complementary data lines of the second system; and references MA0, MAm+1 designate standard main amplifiers. Main amplifiers MA1 through MAm are controlled to output from the corresponding input/output terminal in response to a change of data in the standard pair of complementary data lines output from the standard intermediate latch circuit LA0 to complementary data. Main amplifiers MAm+2 through MAn are controlled to output from the corresponding input/ output terminal in response to a change of data in the standard pair of complementary data lines output from the standard intermediate latch circuit LAm+1 to complementary data.

Details of circuits and operation are the same as those described in Embodiment 11.

EMBODIMENT 13

Figure 26:
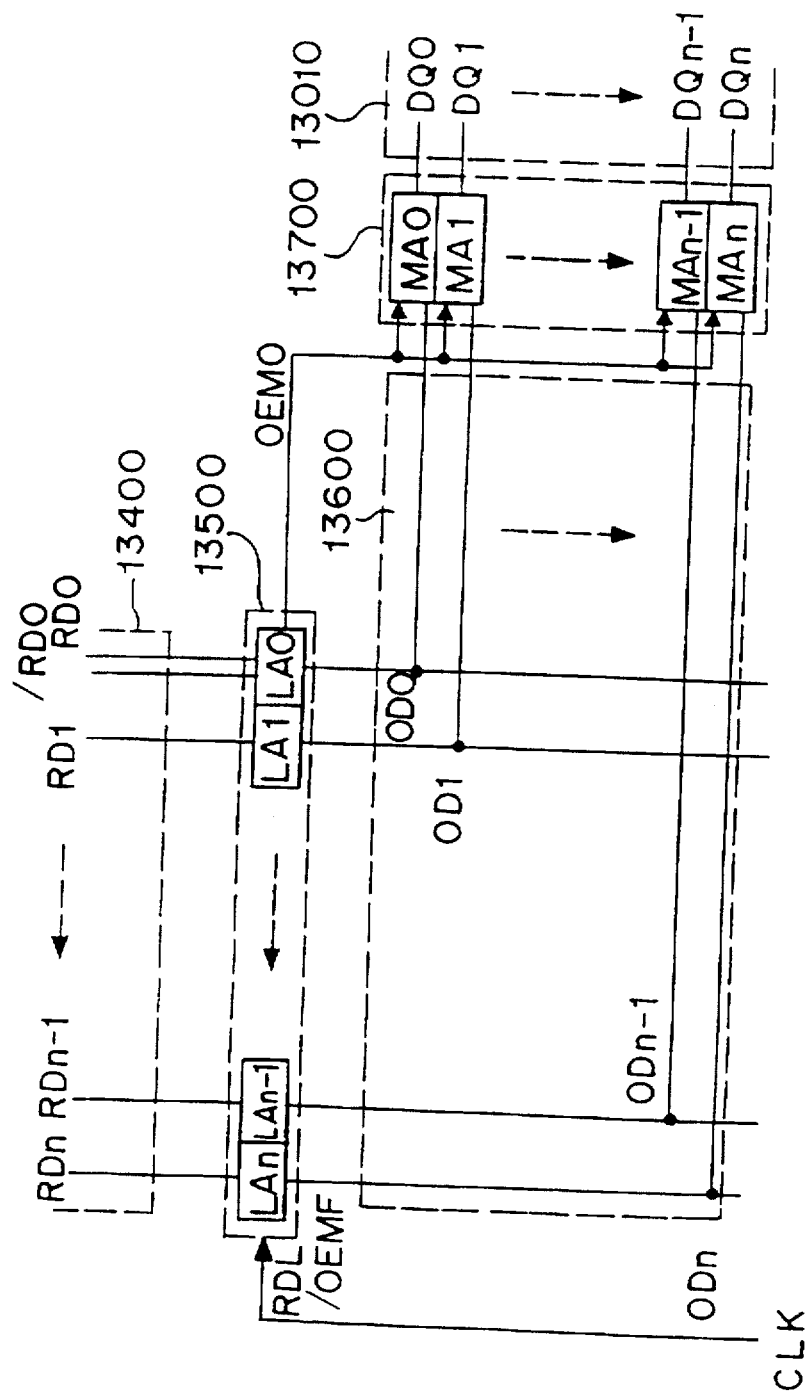
FIG. 26 is a block diagram for showing configurations of a data line area of a first system corresponding to one of array blocks, an intermediate latch circuit area, a data line area of a second system and a main amplifier area in accordance with Embodiment 13 of the present invention.

FIG. 26 is a block chart for showing Embodiment 13 of the present invention. In this Embodiment 13, the present invention is applied particularly to an area including the data lines of the first system and the data lines of the second system in the DRAM shown in FIG. 1. FIG. 26 shows a case that data lines of the first system, intermediate latch circuits, data lines of the second system and main amplifiers, which are corresponding to the one array block 1001 shown in FIG. 1, are respectively as much as n+1. In FIG. 26, a standard pair of complementary data lines exists in a data line area of the first system 13400, the other data lines of the same system are composed of a single data line, and a data line area of the second system 13600 is composed of only single data lines.

In FIG. 26, a pair of complementary data lines of the first system RD0./RD0 is connected to the input of intermediate latch circuit LA0; the other single data lines of the first system RD1 through RDn are respectively connected to the inputs of intermediate latch circuits LA1 through LAn; and the outputs from the intermediate latch circuits LA0 through LAn are connected respectively to single data lines of the second system OD0 through ODn. Further, the single data lines of the second system are respectively connected to the corresponding main amplifiers MA0 through MAn. The main amplifiers MA0 through MAn output data to the outside from input/output terminals DQ0 through DQn.

Hereinbelow, the pair of complementary data lines of the first system RD0./RD0 is referred to as a standard pair of complementary data lines and the corresponding intermediate latch circuit is referred to as a standard intermediate latch circuit LA0.

Figure 27:
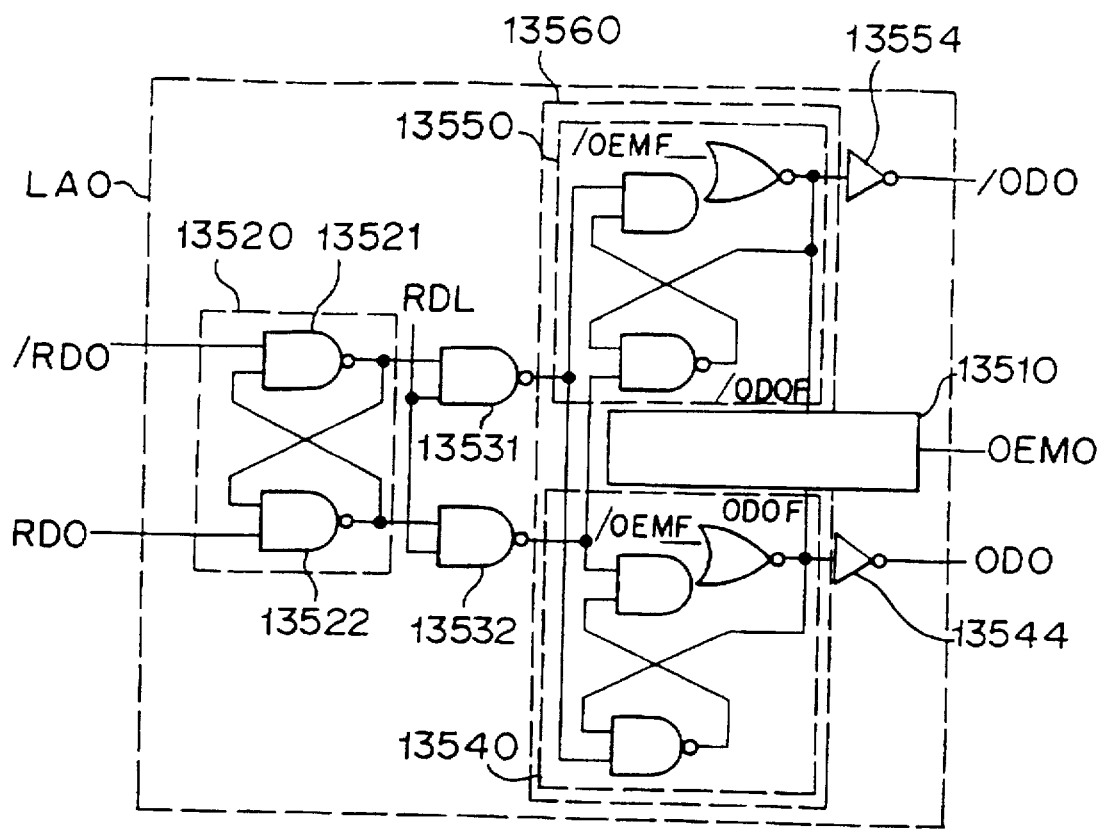
FIG. 27 is a circuit diagram of a standard intermediate latch circuit LA0 shown in FIG. 26.

FIG. 27 is a circuit diagram of the standard intermediate latch circuit LA0 connected to the standard pair of complementary data lines RD0./RD0 shown in FIG. 26. A numerical reference 13520 intakes valid data transmitted through the standard pair of complementary data lines RD0./RD0 when the data become complementary to each other, and inverts and outputs the data. Thereafter, this latch circuit 13520 is composed of NAND gates 13521 and 13522 for maintaining data output before pre-charging the standard pair of complementary data lines RD0./RD0 even though the standard pair of complementary data lines RD0./RD0 is pre-charged so as to be at the H level. Numerical references 13531 and 13532 designate NAND gates which input the output from the latch circuit 13520 respectively and a signal for controlling data holding RDL.

A numerical reference 13560 designates a circuit which receives a signal /OEMF activated at earlier timing than the outputs from the NAND gates 13531 and 13532 and an output control signal OEM input to a main amplifier and holds these automatically when the valid data transmitted through the pair of data lines of the first system RDn./RDn become data complementary to each other as the outputs from the NAND gates 13531 and 13532. A numerical reference 13540 designates a composite gate for holding the valid data transmitted through the data line RDn, which is one of the pair of data lines of the first system, output from the NAND gate 13532. A numerical reference 13550 designates a composite gate for holding the valid data transmitted through the data line /RDn, which is the other one of the pair of data lines of the first system, output from the NAND gate 13531.

A numerical reference 13544 designates an inverter which inverts the output from the composite gate 13540 and drives the data line of the second system ODn. Further, when /OEMF input to the composite gate 13560 is deactivated, namely changed to the H level, the data line of the second system ODn is pre-charged.

As described in the above, automatic latch circuits such as the latch circuit 13520 and the composite gates 13550, 13540 in the intermediate latch circuit shown in FIG. 27 is a circuit for efficiently performing a control of three kinds of states by avoiding a loss of time as small as possible, wherein the three kinds of states are the data line RD0 of the H level and the data line /RD0 of the L level, the data line RD0 of the L level and the data line /RD0 of the H level, and the data lines RD0./RD0 of the H level.

Figure 28:
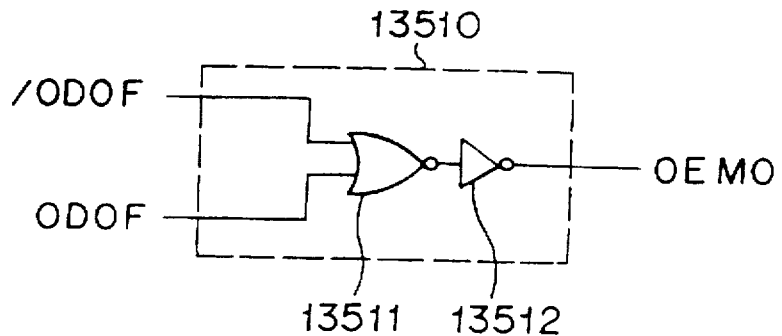
FIG. 28 is a circuit diagram of a valid data detecting circuit shown in FIG. 27.

FIG. 28 is a detailed circuit diagram of a circuit for detecting valid data shown in FIG. 27. In FIG. 28, a numerical reference 13511 is an NOR gate which inputs the outputs OD0F and /OD0F respectively from the composite gates 13540 and 13550, wherein it outputs the H level when the data in OD0F and the data in /OD0F become complementary to each other. This output is a signal for controlling the outputs from the main amplifiers MA0 through MAn and becomes a standard signal for controlling data output OEM0. The other intermediate latch circuits LA1 through LAn are the same as those shown in FIG. 8.

Figure 29:
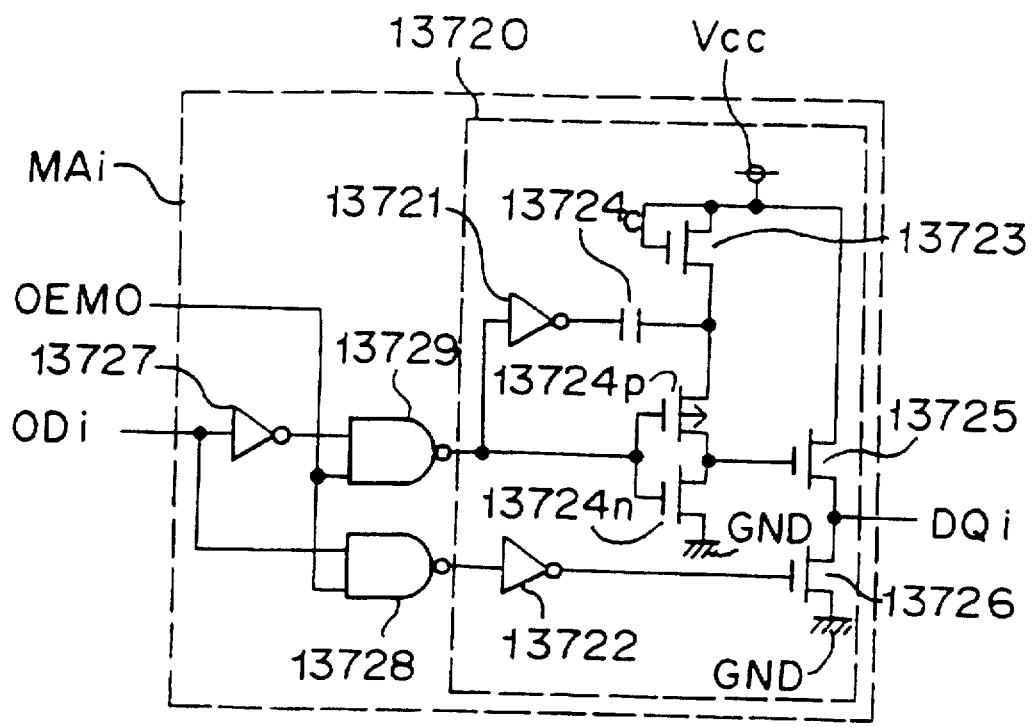
FIG. 29 is a circuit diagram of main amplifiers MA0 through MAn shown in FIG. 26.

FIG. 29 is a circuit diagram for showing the main amplifiers MA0 through MAn according to Embodiment 13. In the Figure, a reference Vcc designates a source electric potential; a reference GND designates a ground electric potential; and a numerical reference 13728 designates an NAND gate which inputs the standard signal for controlling data output OEM0 and data transmitted through a single data line of the second system ODi, which inverts the data transmitted through the data line ODi when the standard signal for controlling data output OEM0 is activated, and transmits the inverted data to an output buffer 13720. A numerical reference 13729 designates an NAND gate which inputs the signal for controlling data output OEM0 and data obtained by inverting data transmitted through the single data line of the second system ODi by an inverter 13727, which gate transmits the inverted data from the data line ODi to the output buffer 13720 when the standard signal for controlling data output OEM0 is activated.

The output buffer 13720 has the same structure as the standard main amplifier shown in FIG. 18, wherein the outputs from the NAND gates 13729 and 13728 correspond to the input data OD0./OD0 shown in FIG. 18.

Figure 30:
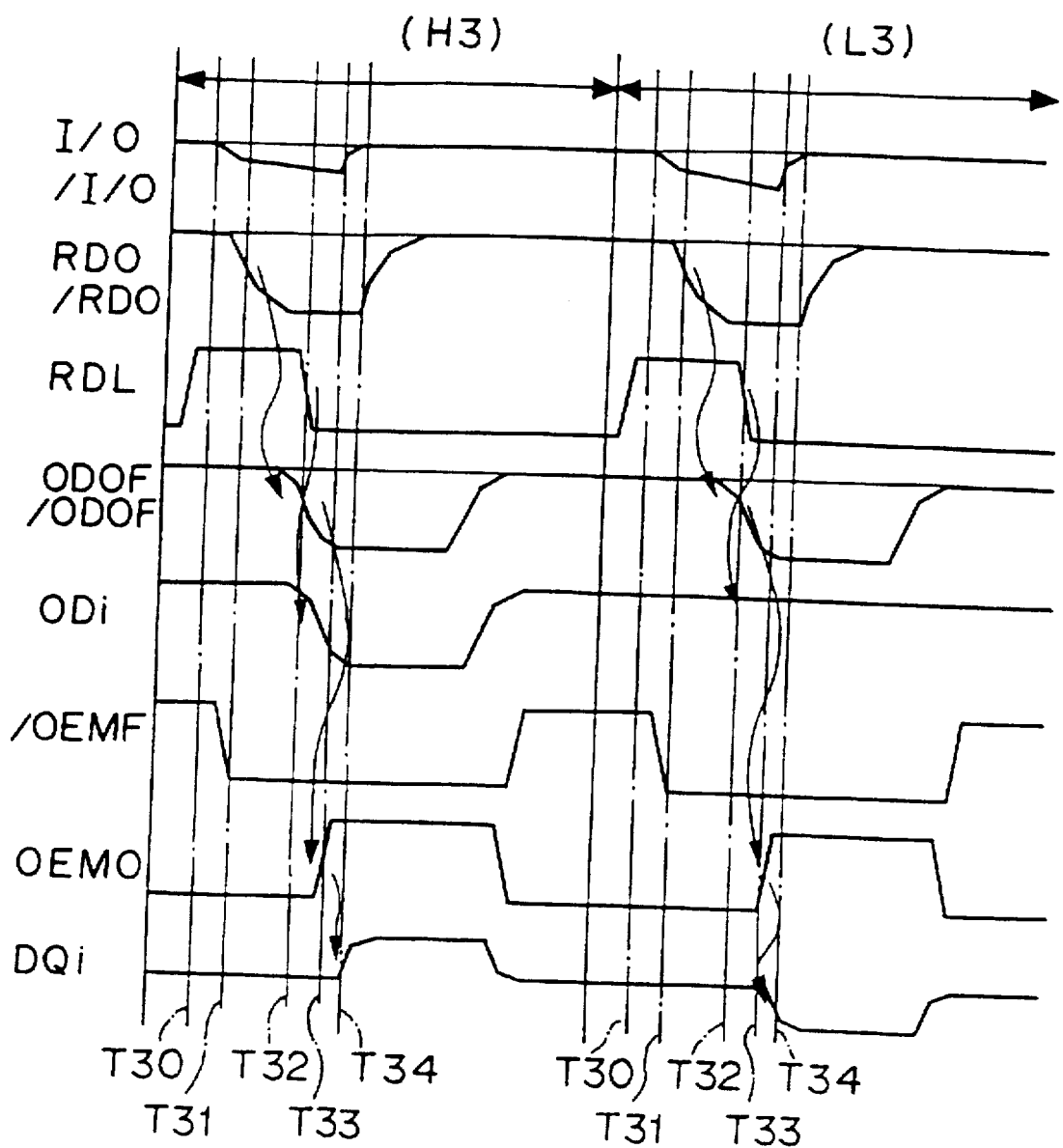
FIG. 30 is timing chart for showing an operation of DRAM in accordance with Embodiment 13 of the present invention.

In the next, operation will be described. FIG. 30 is a timing chart for showing the operation according to Embodiment 13.

References I/O, /I/O designate a pair of bit lines and simultaneously data in a memory cell transmitted through a sense amplifier to a pair of I/O lines. In this embodiment, identical data are read out by pairs of I/O lines suffixed by 0 through n. References RD0./RD0 designate data transmitted through the standard pair of complementary data lines of the first system; a reference RDL designates a signal for controlling data holding of the intermediate latch circuit; references OD0F./OD0F designate data of OD0F./OD0F input in the circuit for detecting valid data of the standard intermediate latch circuit LA0; a reference ODi designates data transmitted through the single data line of the second system ODi output from the other intermediate latch circuit LAi; a reference/OEMF designates a signal for pre-charging the output from the standard intermediate latch circuit LA0; a reference OEM0 designates the standard signal for controlling data output which is a result of detection obtained in the circuit for detecting valid data 13510 in the standard intermediate latch circuit LA0; and a reference DQi designates data output from an input/output terminal DQi, wherein identical data are output to those represented by 0 through n in this case shown by the timing chart. In FIG. 30, a reference (H3) shows a case that data output from the input/output terminal DQi is at the H level, and a reference (L3) shows a case that the output data is at the L level.

Data in a memory cell at an address designated at a time T30 appear in a pair of I/O lines after passing through a pair of bit lines and a sense amplifier. Hereinbelow, these data are referred to as valid data.

The preamplifier is activated at a time T31 and the L level is output to one of the standard pair of complementary data lines of the first system RD0 and the H level is output to the other /RD0. In the Figure, a preamplifier activation signal PAE is not shown.

At a time T32, the valid data transmitted through the standard pair of complementary data lines of the first system RD0./RD0 arrive at the standard intermediate latch circuit LA0 shown in FIG. 27. Then, the valid data become complementary are taken in the latch circuit 13520 composed of the NAND gates 13521 and 13522 of the standard intermediate latch circuit LA0, whereby the output from the NAND gate 13521 is at the L level and the output from the NAND gate 13522 is at the H level. Now, since the signal for controlling data holding RDL is at the H level, the complementary data are inverted by the NAND gates 13531 and 13532, and are transmitted to the composite gates 13550 and 13540. Further, since the pre-charge signal /OEMF is already at the L level, these data are automatically held respectively and /OD0F of the L level and OD0F of the H level are respectively output.

At a time T33, the circuit for detecting valid data 13510 shown in FIG. 28 detects an event that these /OD0F and OD0F become complementary data, whereby the output from the NOR gate 13511 becomes at the L level and is inverted by the inverter 15312, whereby the standard signal for controlling data output OEM0 becomes at the H level.

At a time T34, each main amplifier MAi receives the result of detection obtained by the circuit for detecting valid data 13510 and thereby becomes in a state of enabling outputs from an input/output terminal DQi. When the valid data transmitted through the single data line of the second system ODi arrive at the main amplifier, the OEM0 is at the H level; data in the single data line ODi are at the L level; the output from the NAND gate 13728 is at the H level; and the output from the NAND gate 13729 is at the L level. Upon receipt of the output from the NAND gate 13728, the inverter 13722 outputs the L level and thereby the N-channel type transistor 13726 is not conducted. Meanwhile, since the output from the NAND gate 13729 is at the L level, the P-channel type transistor 13724p is conducted. The source electric potential of the P-channel type transistor 13724p is pre-charged to be an electric potential of Vcc-Vth of the N-channel type transistor for charging 13723, where Vth designates a threshold voltage of the N-channel type transistor 13723. Further, when the output from the NAND gate 13729 becomes at the L level, the output from the inverter 13721 becomes at the H level to apply the level to one of electrodes of a capacitance for boosting 13724c. Therefore, the electric potential at the source side of the P-channel type transistor 13724p, which is connected to the other electrode of the capacitance for boosting 13724c, is boosted to be an electric potential of Vcc-Vth+α. Accordingly, the gate of the N-channel type transistor 13725 is applied with the electric potential of Vcc-Vth+α, and data of the H level equal to the source electric potential are output to drive from the input/output terminal DQi. The period represented by (L3) shows a case that data output from the input/output terminal DQi are at the L level, namely a case that the valid data appear in a pair of I/O lines after passing through a memory cell, a pair of bit lines and a sense amplifier are inverted, wherein operation in the period represented by T31 through T34 are the same as those described in the above.

As mentioned in the above, the valid data transmitted through the standard pair of complementary data lines of the first system RD0./RD0, which data are subjected to ternary control, arrive at the standard intermediate latch circuit LA0. Such an output is detected by the circuit for detecting valid data 13510 in the standard intermediate latch circuit LA0. By a signal OEM0 corresponding to such a detection signal controls timing for outputting valid data transmitted through the single data lines of the second system OD0 through ODn, which are subjected to binary control, from the corresponding main amplifier through the corresponding input/output terminal among DQ1 through DQn.

EMBODIMENT 14

Figure 31:
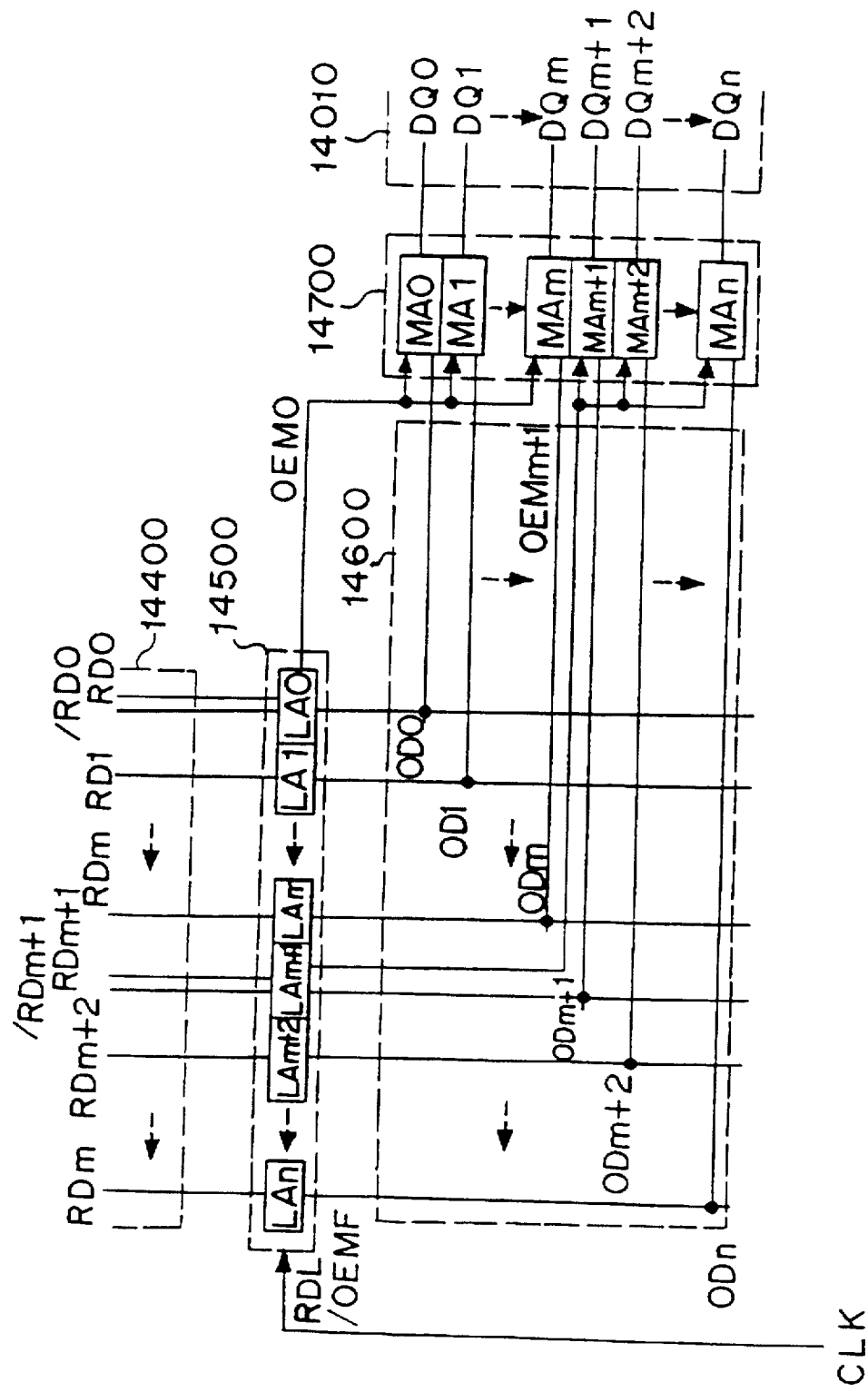
FIG. 31 is a block diagram for showing configurations of a data line area of a first system, an intermediate latch circuit area, a data line area of a second system and a main amplifier area in accordance with Embodiment 14.
Figure 32:
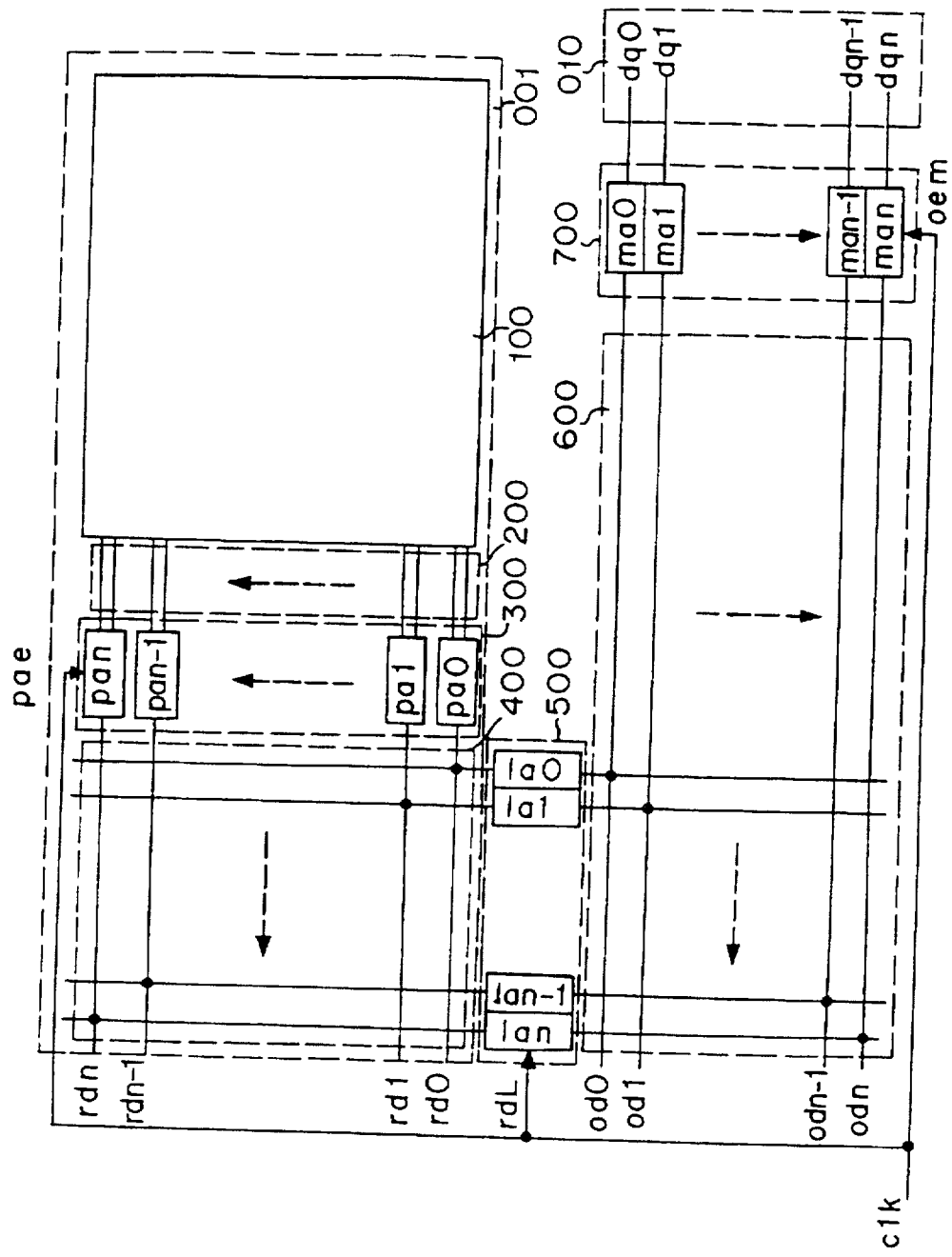
FIG. 32 is a block diagram for showing configurations of one of array blocks in a conventional DRAM, a data line area of a first system, an intermediate latch circuit area, a data line area of a second system and a main amplifier area respectively corresponding thereto.
Figure 33:
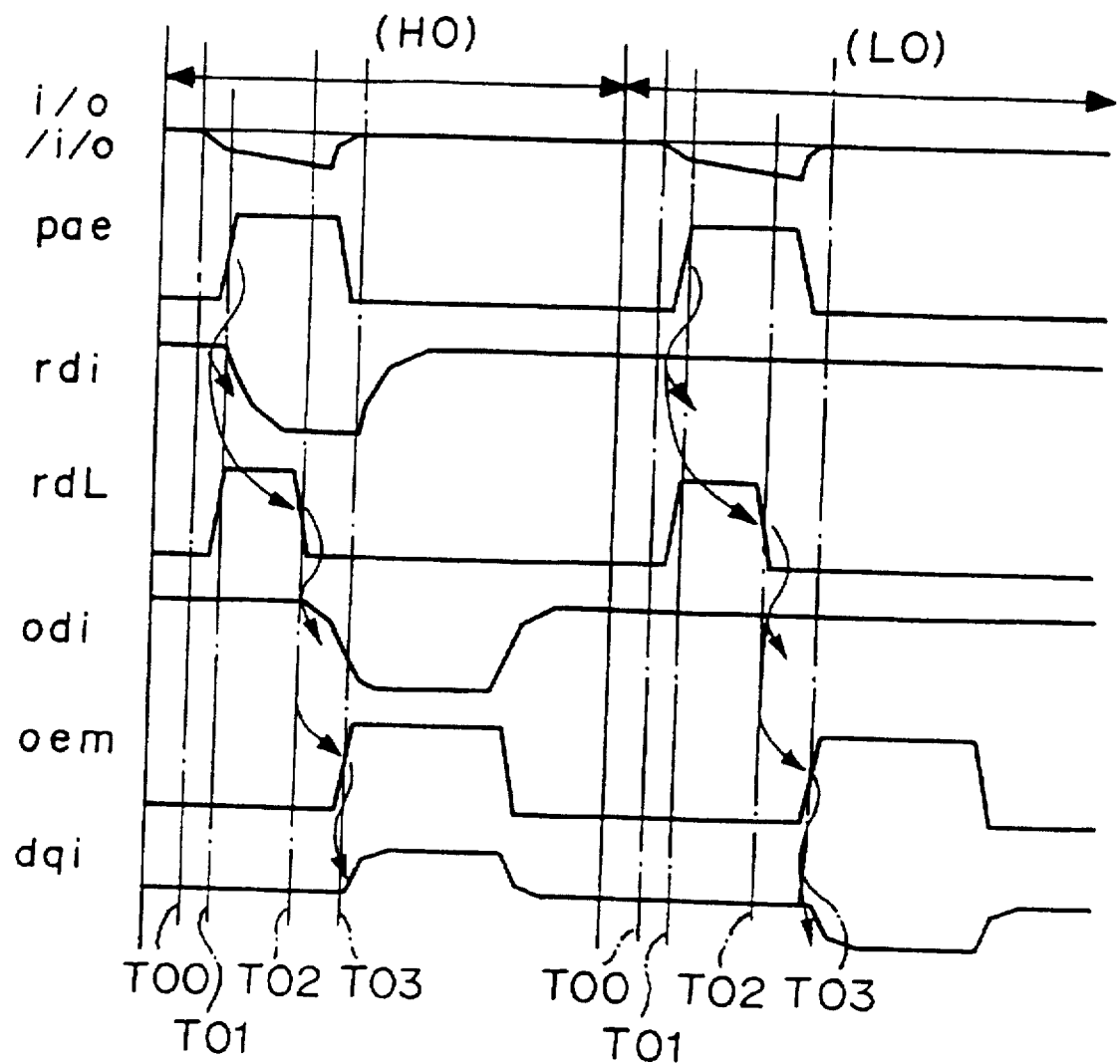
FIG. 33 is a timing chart for showing an operation of the conventional DRAM shown in FIG. 32.

FIG. 31 is a block diagram for showing Embodiment 14 of the present invention. In the structure described in Embodiment 13, the one standard pair of complementary data lines is provided in the data lines of the first system as much as n+1 with respect to one array block. However, in FIG. 31, two standard pairs of complementary data lines are provided in the data lines of the first system as much as n+1. In Embodiment 14, two standard pairs of complementary data lines are provided in a data line area of the first system 14400 and the other data lines in the same system are single data lines, and a data line area of the second system 14600 is composed of only single data lines.

In Embodiment 14, the standard pairs of complementary data lines are designated by a RD0./RD0 and RDm+1./RDm+1, and standard intermediate latch circuits are designated by LA0 and LAm+1. Main amplifiers MA0 through MAm are controlled by a standard signal for controlling data output OEM0 output from the standard intermediate latch circuit LA0, and main amplifiers MAm+1 through MAn are controlled by a standard signal for controlling data output OEMm+1 output from the standard intermediate latch circuit LAm+1. Details of these standard circuits and operation thereof are the same as those described in Embodiment 13.

Further, it is possible to further increase the number of the standard pairs of complementary data lines. Further, it is also possible to provide the standard pairs of complementary data lines commonly with respect to a plurality of array blocks.

The first advantage of a semiconductor integrated circuit according to the present invention is that data transmitted through single data lines can be controlled at timing of controlling data transmitted through a pair of complementary data lines having an effect of a high speed, and the high speed and a reduction in a chip size can be simultaneously obtainable because the circuit comprises the pair of complementary data lines subjected to ternary control, through which data complementary to each other are transmitted when valid data are transmitted, single data lines subjected to binary control, through which data of the same system as that of the pair of complementary data lines are transmitted and a circuit for detecting valid data which confirms an arrival of the valid data by detecting a change of the data transmitted through the pair of complementary data lines to the data complementary to each other and a signal for controlling data which performs a control of data in response to the data transmitted through the single data lines.

The second advantage thereof is that it is possible to effectively arrange a system having a complicated layout of wiring, in particular a local system such as a system having a large area for wiring because a pair of complementary data lines and single data lines are constituted to be data lines of a first system in which data output from amplifiers and input in latch circuits are transmitted among a plurality of systems separated by the amplifiers or the latch circuits.

The third advantage thereof is that timing for holding valid data transmitted through single data lines in latch circuits can be automatically generated in response to a transmission rate of data because the signal for controlling data is constituted to be a signal for controlling data holding which controls timing for holding the data in the above data lines of the first system of the above latch circuits.

The fourth advantage thereof is that a wiring layout of data lines can be designed in response to the number of memory array blocks, arrangement of the memory array block and the bit number of memories because a plurality of groups composed of a plurality of single data lines are provided with respect to one pair of complementary data lines.

The fifth advantage thereof is that data can be controlled at timing without causing a loss with respect to an arrival time of valid data to each amplifier and a high access speed can be obtained because a circuit for detecting valid data is provided for each amplifier connected to a single data line and it is constituted such that the above-mentioned signal for controlling data controls the output from the corresponding amplifier.

The sixth advantage of a semiconductor integrated circuit according to the present invention is that an area of layout can be reduced and a high access speed can be obtained because the circuit comprises a pair of complementary data lines subjected to ternary control, through which data complementary to each other are transmitted when valid data are transmitted, single data lines subjected to binary control, through which data of a first system, which is the same system as that of the above pair of complementary data lines, are transmitted and a circuit for detecting valid data which confirms an arrival of the valid data by detecting a change of data transmitted through the pair of complementary data lines to complementary data and generates a signal for controlling data transmitted through data lines of the succeeding system.

The seventh advantage of a semiconductor integrated circuit according to the present invention is that an area of layout can be reduced and a control of timing, such as holding valid data and outputting to drive, can be conducted at a high speed to enhance an access speed because the circuit comprises a plurality of word lines, a plurality of bit lines arranged so as to cross the plurality of word lines, a plurality of memory cells arranged with respect to the intersections between the plurality of word lines and the plurality of bit lines, a memory cell array bock having a plurality of sense amplifiers provided in correspondence with the plurality of bit lines, a plurality of pairs of I/O lines provided in correspondence with the memory cell array block, a standard pair of complementary data lines for transmitting data corresponding to data transmitted through a predetermined pair of I/O lines among the plurality of pairs of I/O lines through its pair of complementary data lines including two lines in a group, a circuit for detecting valid data which detects an event that data transmitted through the standard pair of complementary data lines are data complementary to each other, single data lines which transmit data corresponding to data transmitted through the other pairs of I/O lines among the plurality of pairs of I/O lines and a drive circuit which receives a result of detection obtained by the circuit for detecting valid data, inputs from the above single data lines and outputs data corresponding to data transmitted through the above single data lines.

The eighth advantage thereof is that, in a semiconductor integrated circuit using a pipeline method, in which a several stages are used to read out data from a memory cell to an input/output terminal in synchronism with an outer master clock, the data can be held and output to drive securely, and a transmission rate of data can be high because a drive circuit is constituted to be an intermediate latch circuit The ninth advantage thereof is that an access speed to an output from an input/output terminal can be high because a drive circuit is constituted to be a main amplifier.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor integrated circuit comprising:

a pair of complementary data lines subjected to ternary control, through which data complementary to each other are transmitted when valid data are transmitted, single data lines subjected to binary control, said single data lines and said pair of complimentary data lines being arranged for supplying data of a common system, and a circuit for detecting the valid data, said circuit confirming arrival of the valid data by detecting a change of said data transmitted through said pair of complementary data lines to be complementary to each other for generating a data control signal for controlling transfer of a data signal corresponding to data transmitted through said single data lines.

2. A semiconductor integrated circuit according to claim 1, wherein said pair of complementary data lines and said single data lines are data lines of a first system which transmit data output from amplifiers and input in latch circuits among a plurality of systems separated by the amplifiers or the latch circuits.

3. A semiconductor integrated circuit according to claim 2, wherein said data control signal is a signal for controlling data holding which controls timing for holding the data transmitted through said data lines of the first system in said latch circuit.

4. A semiconductor integrated circuit according to claim 1, wherein said data control signal is a signal for controlling data output which controls timing for outputting data corresponding to data in data lines of another system, which transmit data output from latch circuits and input in amplifiers from an output terminal.

5. A semiconductor integrated circuit according to claim 1, wherein a plurality of groups composed of a plurality of said single data lines are provided with respect to said pair of complementary data lines.

6. A semiconductor integrated circuit according to claim 1, wherein said circuit for detecting the valid data is provided for each amplifier connected to said single data lines, and said data control signal controls the output from the corresponding amplifier.

7. A semiconductor integrated circuit comprising:

a pair of complementary data lines subjected to ternary control, through which data complementary to each other are transmitted when valid data are transmitted, single data lines subjected to binary control, said single data lines and said pair of complimentary data lines being arranged for supplying data of a common system, and a circuit for detecting the valid data, said circuit confirming arrival of the valid data by detecting a change of data transmitted through said pair of complementary data lines to be complementary to each other for generating a signal for controlling data transmitted through data lines of a succeeding system.

8. A semiconductor integrated circuit comprising:

a plurality of word lines, a plurality of bit lines disposed so as to cross said plurality of word lines, a plurality of memory cells disposed with respect to the intersections between said plurality of word lines and said plurality of bit lines, a memory cell array block having a plurality of sense amplifiers provided in correspondence with said plurality of bit lines, a plurality of pairs of I/O lines provided in correspondence with said memory cell array block, a standard pair of complementary data lines for transmitting data corresponding to data transmitted through a predetermined pair of I/O lines among said plurality of pairs of I/O lines, a circuit for detecting valid data, said circuit detecting an event indicating that the data transmitted through said standard pair of complementary data lines become complementary to each other, single data lines which transmit data corresponding to data transmitted through the other pairs of I/O lines among said plurality of pairs of I/O lines, and drive circuits which receive a result of the detection obtained by said circuit for detecting valid data, to perform data input from said single data lines and to output data corresponding to data transmitted through said single data lines.

9. A semiconductor integrated circuit according to claim 8, wherein said drive circuits are intermediate latch circuits.

10. A semiconductor integrated circuit according to claim 8, wherein said drive circuits are main amplifiers.

11. A semiconductor integrated circuit according to claim 8, further comprising:

a plurality of preamplifiers provided in correspondence with said plurality of pairs of I/O lines, wherein said pair of complementary data lines and said single data lines are respectively connected to outputs from the corresponding preamplifiers.

* * * * *